(12) United States Patent
Kabbani et al.

(10) Patent No.: US 12,259,428 B1
(45) Date of Patent: Mar. 25, 2025

(54) MULTIPLEXED THERMAL CONTROL WAFER AND COLDPLATE

(71) Applicant: AEM Singapore Pte. Ltd., Singapore (SG)

(72) Inventors: Samer Kabbani, Laguna Niguel, CA (US); Taneli Veistinen, Lieto (FI); Terry Sinclair Connacher, Tempe, AZ (US); Sami Mikola, Mynämäki (FI); Thomas P. Jones, Stanwood, MI (US); Ari Kuukkala, Turku (FI)

(73) Assignee: AEM Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/642,142

(22) Filed: Apr. 22, 2024

Related U.S. Application Data

(63) Continuation of application No. 18/390,918, filed on Dec. 20, 2023, now Pat. No. 12,000,885.

(51) Int. Cl.
*G01R 31/28* (2006.01)
(52) U.S. Cl.
CPC ..... *G01R 31/2875* (2013.01); *G01R 31/2877* (2013.01)
(58) Field of Classification Search
CPC ............ G01R 31/2874; G01R 31/2875; G01R 31/2877
See application file for complete search history.

(56) References Cited

U.S. PATENT DOCUMENTS

| 5,280,422 A | 1/1994 | Moe et al. |
| 5,521,850 A | 5/1996 | Moe et al. |
| 6,225,608 B1 | 5/2001 | Kaellgren |

(Continued)

FOREIGN PATENT DOCUMENTS

| EP | 0947903 A1 | 10/1999 |
| EP | 2316286 A1 | 5/2011 |

(Continued)

OTHER PUBLICATIONS

Non-Final Office Action mailed Dec. 7, 2023, for U.S. Appl. No. 18/471,192, filed Sep. 20, 2023, six pages.

(Continued)

*Primary Examiner* — Tung X Nguyen
(74) *Attorney, Agent, or Firm* — Morrison & Foerster LLP

(57) ABSTRACT

Disclosed herein are systems and methods for controlling temperature(s) using a thermal control assembly (TCA) and a coldplate. The TCA comprises independently controllable thermal zones for controlling its top surface temperature. The thermal zones may be heater zones, cooling zones, or both. Energy input to the TCA may be selectively applied by, e.g., a thermal controller, such that different sets of thermal zones receive the energy at different times. In some embodiments, the energy input to the TCA may be selectively applied to two more independently controllable heater zones at the same time, the energy input to the TCA may be selectively applied to two or more independently controllable cooling zones at the same time, or both. In some aspects, less than all thermal zones may be activated at the same time, providing a higher power density for the thermal zones for a given energy input to the TCA.

23 Claims, 27 Drawing Sheets

(56) References Cited

U.S. PATENT DOCUMENTS

| | | |
|---|---|---|
| 6,549,026 B1 | 4/2003 | Dibattista et al. |
| 6,583,638 B2 | 6/2003 | Costello et al. |
| 6,825,681 B2 | 11/2004 | Feder et al. |
| 6,985,000 B2 | 1/2006 | Feder et al. |
| 6,992,500 B2 | 1/2006 | Sugiyama et al. |
| 7,196,295 B2 | 3/2007 | Fennewald et al. |
| 7,601,935 B2 | 10/2009 | Fennewald et al. |
| 8,289,040 B2 | 10/2012 | Komoto et al. |
| 8,680,443 B2 | 3/2014 | Mcmillin et al. |
| 9,713,345 B2 | 7/2017 | Farine et al. |
| 10,104,718 B2 | 10/2018 | Wallinger |
| 10,760,465 B2 | 9/2020 | Everly et al. |
| 10,934,921 B2 | 3/2021 | Culbertson et al. |
| 11,340,283 B2 | 5/2022 | Kasai et al. |
| 11,674,999 B2 | 6/2023 | Kabbani et al. |
| 11,828,796 B1 | 11/2023 | Ostrowski et al. |
| 12,000,885 B1 | 6/2024 | Kabbani |
| 12,013,432 B1 | 6/2024 | Ostrowski |
| 2006/0164111 A1 | 7/2006 | Lopez et al. |
| 2007/0138166 A1 | 6/2007 | Fennewald et al. |
| 2009/0265045 A1 | 10/2009 | Coxe, III |
| 2010/0086991 A1 | 4/2010 | Fish |
| 2011/0022324 A1 | 1/2011 | Knopp et al. |
| 2011/0095777 A1 | 4/2011 | Komoto |
| 2012/0049874 A1 | 3/2012 | Lacroix |
| 2012/0292308 A1 | 11/2012 | Fennewald et al. |
| 2014/0139246 A1 | 5/2014 | Chuang et al. |
| 2017/0100894 A1* | 4/2017 | Burns ............... B29C 64/386 |
| 2018/0196084 A1 | 7/2018 | Tustaniwskyj |
| 2019/0086468 A1 | 3/2019 | Yoshino |
| 2019/0391335 A1 | 12/2019 | Tan |
| 2020/0092951 A1 | 3/2020 | Fennewald et al. |
| 2020/0203240 A1 | 6/2020 | Haehn |
| 2020/0284180 A1 | 9/2020 | Everly et al. |
| 2020/0329533 A1 | 10/2020 | Wallinger et al. |
| 2021/0033666 A1 | 2/2021 | Kasai |
| 2021/0037676 A1 | 2/2021 | Malouin |
| 2021/0263542 A1 | 8/2021 | Breitlow et al. |
| 2021/0302501 A1 | 9/2021 | Su |
| 2022/0053609 A1* | 2/2022 | Phillips ............... G01K 3/14 |
| 2022/0155364 A1 | 5/2022 | Kabbani et al. |
| 2022/0155384 A1 | 5/2022 | Lovati |
| 2022/0206060 A1* | 6/2022 | Tustaniwskyj ..... G01R 31/2874 |
| 2022/0221509 A1 | 7/2022 | Kasai |
| 2024/0079839 A1 | 3/2024 | Green |

FOREIGN PATENT DOCUMENTS

| | | |
|---|---|---|
| JP | 2001210683 A | 8/2001 |
| WO | 2022053782 A1 | 3/2022 |

OTHER PUBLICATIONS

Non-Final Office Action mailed Mar. 22, 2024, for U.S. Appl. No. 18/390,935, filed Dec. 20, 2023, twenty pages.
Non-Final Office Action mailed Mar. 8, 2024, for U.S. Appl. No. 18/390,951, filed Dec. 20, 2023, seventeen pages.
Non-Final Office Action mailed Nov. 24, 2023, for U.S. Appl. No. 18/454,741, filed Aug. 23, 2023, six pages.
Non-Final Office Action mailed Nov. 8, 2023, for U.S. Appl. No. 18/454,737, filed Aug. 23, 2023, six pages.
Notice of Allowance (corrected) mailed Aug. 31, 2023, for U.S. Appl. No. 18/311,164, filed May 2, 2023, four pages.
Notice of Allowance mailed Apr. 1, 2024, for U.S. Appl. No. 18/390,918, filed Dec. 20, 2023, seven pages.
Notice of Allowance mailed Apr. 4, 2024, for U.S. Appl. No. 18/471,192, filed Sep. 20, 2023, seven pages.
Notice of Allowance mailed Aug. 16, 2023, for U.S. Appl. No. 18/311,164, filed May 2, 2023, seven pages.
Notice of Allowance mailed Feb. 16, 2024, for U.S. Appl. No. 18/454,737, filed Aug. 23, 2023, seven pages.
Notice of Allowance mailed Jul. 11, 2023, for U.S. Appl. No. 18/311,164, filed May 2, 2023, eight pages.
Notice of Allowance mailed Mar. 1, 2024, for U.S. Appl. No. 18/454,741, filed Aug. 23, 2023, seven pages.
Notice of Allowance mailed May 30, 2024, for U.S. Appl. No. 18/471,192, filed Sep. 20, 2023, seven pages.
Notice of Allowance mailed May 8, 2024, for U.S. Appl. No. 18/454,737, filed Aug. 23, 2023, seven pages.
Notice of Allowance mailed May 8, 2024, for U.S. Appl. No. 18/454,741, filed Aug. 23, 2023, seven pages.
Final Office Action mailed Jun. 26, 2024, for U.S. Appl. No. 18/390,935, filed Dec. 20, 2023, twenty-five pages.
Final Office Action mailed Jun. 27, 2024, for U.S. Appl. No. 18/390,951, filed Dec. 20, 2023, nineteen pages.

* cited by examiner

MULTIPLEXED THERMAL CONTROL WAFER AND COLDPLATE

CROSS REFERENCE TO RELATED APPLICATIONS

This application is a continuation of U.S. Non-Provisional application Ser. No. 18/390,918, filed on Dec. 20, 2023, the entire content of which is hereby incorporated by reference herein.

FIELD

The present disclosure relates to methods for controlling one or more temperatures of integrated circuit (IC) wafers or chips, and more specifically, controlling a thermal control wafer and a coldplate, such as during wafer probe testing.

BACKGROUND

It is common for some electronic devices to be fabricated in or on a semiconductor substrate such as a wafer (typically a thin, round disk) or panel. In some cases, electronic devices can be fabricated in or on a semiconductor substrate of another format, such as a rectangular panel. In either case, it is typically a requirement for the electrical characteristics or operation of the electronic devices to be assessed through an electrical test operation that accepts the wafer or panel as input. In some cases, this test operation is referred to as a wafer probe test and the semiconductor substrate that comprises the electronic devices being tested is referred to as a wafer under test (WUT). "WUT" as used herein comprises any format of a semiconductor substrate with electronic devices undergoing an electrical test operation, whether the semiconductor substrate comprises a round, thin shape, a rectangular shape, or any other format. An electronic device undergoing a test operation on the WUT is referred to as a device under test (DUT). In some instances, multiple DUTs may be tested at a time. In some cases, a semiconductor substrate includes electronic devices that comprise active devices (such as transistors), passive devices (such as inductors), and conductive interconnects organized to create a circuit (e.g., an integrated circuit) that provides a desired complex function, such as a memory or processor. In some instances, multiple copies of the same electronic device are arranged on the semiconductor substrate, and each copy may be referred to as a chip or die. In some cases, the electronic devices on the WUT are not integrated circuits, but may be simpler devices such as discrete transistors, diodes, or the like. In other cases, the electronic devices on the WUT may be integrated circuits that are organized to provide a more simplified function (e.g., a communications interface or a single processor core) versus the complex function of a memory or processor chip. These types of integrated circuits with simpler functions are sometimes referred to as chiplets. For the purposes of this discussion, a chip refers to a non-limiting description of an electronic device found on a WUT that may encompass an integrated circuit, a chip, a die, a transistor, a diode, a passive component, or any other electronic device. And those broadly-defined chips that are undergoing testing are the DUTs. Chip power including power density (power of a chip divided by its surface area) has been increasing for some chips. A thermal control system may be used to heat and/or cool areas or zones of one or more chips that form a device under test (DUT) or wafer under test (WUT). In some instances, the power density of the thermal control system may need to be the same as or close to the power density of the one or more chips.

For wafer probe testing, heating and/or cooling a DUT may comprise using a thermal mass (e.g., a heated and/or cooled apparatus) that the semiconductor wafer thermally couples to during testing. For example, the semiconductor wafer may be placed on an apparatus that includes thermal control elements. A thermal controller changes the temperature of the thermal control elements based on a set point temperature or maintains it, which then affects the temperature of the semiconductor wafer and DUT. However, the thermal control elements may not adequately respond to localized temperature changes that occur due to, e.g., individual high-performance IC chips being tested when operating within its targeted performance, limiting the wafer probe testing of certain IC chips. Furthermore, the apparatus or thermal control elements, due to their large thermal mass, may not be able to quickly transition from one set point temperature to another. Any delay in transitioning from one temperature to another is costly since the tester is idle and not utilized during the temperature transition. Another issue with thermal control elements can arise when a high-powered chip is being tested and the thermal control elements cannot change temperature fast enough and/or with sufficient magnitude to keep the chip within an acceptable temperature range. In some cases, the temperature of the chip may be too high, causing damage to the probe card and/or the DUT itself.

Systems and methods that adequately respond to localized temperature changes, transition quickly from one set point temperature to another, provide a high-power density, and/or reduce overall testing costs and times are desired.

SUMMARY

Disclosed herein are systems and methods for controlling one or more temperatures using a thermal control assembly (TCA) and a coldplate. The TCA comprises independently controllable thermal zones for controlling its top surface temperature. The thermal zones may be heater zones, cooling zones, or both. Energy input to the TCA may be selectively applied by, e.g., a thermal controller, such that different sets of thermal zones receive the energy at different times. In some embodiments, the energy input to the TCA may be selectively applied to two more independently controllable heater zones at the same time, the energy input to the TCA may be selectively applied to two or more independently controllable cooling zones at the same time, or both. In some aspects, less than all thermal zones may be activated at the same time, providing a higher power density for the thermal zones for a given energy input to the TCA.

A thermal control assembly (TCA) is disclosed. The TCA comprises: a plurality of independently controllable thermal zones comprising a plurality of independently controllable heater zones and a plurality of independently controllable cooling zones configured to maintain or change a temperature of a top surface of the TCA, wherein an energy input to the TCA is selectively applied to one or more of the plurality of independently controllable heater zones. Additionally or alternatively, in some embodiments, the energy input to the TCA is selectively applied to two or more of the plurality of independently controllable heater zones by a demultiplexer. Additionally or alternatively, in some embodiments, the energy input is provided by a high-voltage electrical power source, the high-voltage electrical power source providing a voltage of 200V or higher. Additionally or alternatively, in some embodiments, the energy input is provided by a high voltage source, the high voltage source providing an electrical voltage of 500V, 480V, 400V, 380V, 240V, 230V, or 220V. Additionally or alternatively, in some embodiments, the plurality of independently controllable thermal zones maintaining or changing the temperature of the top surface of the TCA causes maintaining or changing a temperature of a component placed on the top surface of the TCA. Additionally or alternatively, in some embodiments, the component is a semiconductor wafer or panel. Additionally or alternatively, in some embodiments, the semiconductor wafer or panel comprises singulated dies. Additionally or alternatively, in some embodiments, the TCA is configured to receive a semiconductor wafer or panel on the top surface of the TCA, and a perimeter of the TCA is between 1-1.3 times greater than a perimeter of the semiconductor wafer or panel. Additionally or alternatively, in some embodiments, the TCA is configured to: receive a wafer under test (WUT) on the top surface of the TCA, the WUT comprising at least one chip, the at least one chip being a device under test (DUT). Additionally or alternatively, in some embodiments, a size of at least one of the plurality of independently controllable thermal zones is substantially the same as a size of the at least one chip. Additionally or alternatively, in some embodiments, an area of at least one of the plurality of independently controllable thermal zones is smaller than an area of the at least one chip. Additionally or alternatively, in some embodiments, an area of two or more of the plurality of independently controllable zones is equal to or greater than an area of the at least one chip. Additionally or alternatively, in some embodiments, the TCA is configured to receive a wafer under test (WUT) on the top surface of the TCA, the WUT comprising a group of chips, such that one or more of the group of chips are a device under test (DUT). Additionally or alternatively, in some embodiments, a size of at least one of the plurality of independently controllable thermal zones is substantially the same as a size of the group of chips. Additionally or alternatively, in some embodiments, a size of at least one of the plurality of independently controllable thermal zones is larger than a size of the group of chips. Additionally or alternatively, in some embodiments, the TCA is configured to electrically couple to a wafer prober system, the wafer prober system comprising a probe card having probes that electrically couple to a device under test (DUT) during testing, wherein a size of at least one of the plurality of independently controllable thermal zones is substantially the same as a size of an area of the probe card. Additionally or alternatively, in some embodiments, the TCA is configured to electrically couple to a wafer prober system, the wafer prober system comprising a probe card having probes that electrically couple to a device under test (DUT) during testing, wherein a size of at least one of the plurality of independently controllable thermal zones is larger than a size of an area of the probe card. Additionally or alternatively, in some embodiments, the TCA is configured to electrically couple to a wafer probe system, wherein the wafer probe system comprises a chuck base and the TCA is configured to be located over the chuck base. Additionally or alternatively, in some embodiments, the plurality of independently controllable thermal zones is configured as rows of thermal zones, columns of thermal zones, or a combination thereof. Additionally or alternatively, in some embodiments, the plurality of independently controllable thermal zones is configured as concentric rings, concentric arcs, or sectors of thermal zones. Additionally or alternatively, in some embodiments, the TCA further comprises: a thermal control wafer (TCW) comprising: conductive layers, wherein a first conductive layer comprises one or more resistive traces configured as heating-sensing elements and a second conductive layer is configured as an electromagnetic interference (EMI) shield layer, wherein the EMI shield layer is: located closer to the top surface of the TCA than the first conductive layer, and electrically coupled to an electrical ground. Additionally or alternatively, in some embodiments, the TCA further comprises: a thermal control wafer (TCW) comprising: conductive layers comprising a first conductive layer including one or more resistive traces; and a two-wire connection electrically coupled to each of the one or more resistive traces. Additionally or alternatively, in some embodiments, the two-wire connection is electrically coupled to a pair of pins, the pair of pins electrically coupled to a four-wire connection, the four-wire connection electrically coupled to circuitry outside of the TCW. Additionally or alternatively, in some embodiments, the TCA further comprises: a thermal control wafer (TCW) comprising a top surface configured to be located adjacent to a semiconductor wafer, wherein the top surface of the TCW is capable of dissipating electrostatic charges. Additionally or alternatively, in some embodiments, the top surface of the TCW is selectively electrically coupled to ground or other electrical potential. Additionally or alternatively, in some embodiments, at least one of the plurality of independently controllable heater zones has a power density of 0.05 W/mm² or higher. Additionally or alternatively, in some embodiments, at least one of the plurality of independently controllable heater zones has a power density of 0.01 W/mm² or higher. Additionally or alternatively, in some embodiments, the TCW comprises a monolithic substrate. Additionally or alternatively, in some embodiments, the TCW is formed from two or more combined substrates.

A thermal controller is disclosed. The thermal controller comprises: memory comprising instructions which, when executed by a processor, cause the processor to: selectively control a plurality of independently controllable thermal zones of a thermal control assembly (TCA), wherein the TCA comprises a plurality of independently controllable heater zones and a plurality of independently controllable cooling zones, wherein the selective control of the plurality of independently controllable thermal zones causes a temperature of a top surface of the TCA to be maintained or changed. Additionally or alternatively, in some embodiments, the TCA comprises one or more thermal channels, and at least one of the one or more thermal channels comprises two or more of the plurality of independently controllable thermal zones. Additionally or alternatively, in some embodiments, the TCA comprises one or more thermal channels, and at least one thermal channel is associated with a demultiplexer. Additionally or alternatively, in some embodiments, at least one of the plurality of independently controllable heater zones comprises a resistive trace configured as a heater-sensing element; the heater-sensing element is configured to: generate heat through Joule heating during a first time period, and measure resistance during a second time period, wherein the thermal controller is configured to convert the measured resistance to a temperature of the at least one heater zone. Additionally or alternatively, in some embodiments, the thermal controller is configured to: determine the temperature of the at least one heater zone by comparing the measured resistance of the heater-sensing element to pre-determined calibration data. Additionally or alternatively, in some embodiments, the pre-determined calibration data is pre-determined by: measuring a resistance of a resistive trace at a plurality of different temperatures; and storing a correlation between the measured resistance and the plurality of different temperatures. Additionally or alternatively, in some embodiments, a duration of the second time period is 200 microseconds or less. Additionally or alternatively, in some embodiments, the thermal controller is configured to: determine an amount of power to supply to at least one thermal channel based on a PID algorithm, wherein the TCA comprises the at least one thermal channel. Additionally or alternatively, in some embodiments, the amount of power supplied to the at least one thermal channel is regulated by a pulse width modulation (PWM) scheme. Additionally or alternatively, in some embodiments, the thermal controller comprises one or more FPGAs. Additionally or alternatively, in some embodiments, the thermal controller is configured to: receive an input indicative of a location of one or more devices under test (DUTs), a location of a probe card, or both, wherein the selective control of the plurality of independently controllable thermal zones is based on the location. Additionally or alternatively, in some embodiments, the thermal controller is configured to: receive an input indicative of energy, wherein the selective control of the plurality of independently controllable thermal zones comprises selectively controlling the plurality of independently controllable cooling zones by controlling a coolant fluid flow to the plurality of independently controllable cooling zones based on the received input. Additionally or alternatively, in some embodiments, the thermal controller comprises: an FPGA configured to determine a PWM duty cycle for a valve driver that opens and closes one or more flow control valves. Additionally or alternatively, in some embodiments, the selective control of the plurality of independently controllable thermal zones comprises maintaining a temperature of at least one of the plurality of independent-controllable heater zones to within +/−5° C. of a setpoint temperature. Additionally or alternatively, in some embodiments, the thermal controller is configured to: determine an amount of power supplied to the plurality of independently controllable heater zones, wherein the selective control of the plurality of independently controllable thermal zones comprises controlling a coolant fluid flow rate through the plurality of independently controllable cooling zones of the TCA based on the determined amount of power. Additionally or alternatively, in some embodiments, the thermal controller is configured to: determine a temperature of at least one of the plurality of independently controllable heater zones; and receive an input indicative of an amount of power of a device under test (DUT), a temperature of the DUT, or both, wherein the selective control of the plurality of independently controllable thermal zones comprises controlling an amount of power to one or more thermal channels of the TCA based on the determined temperature and the received input. Additionally or alternatively, in some embodiments, the thermal controller is configured to: receive an input indicative of a location of one or more device under test (DUTs); select at least one of the plurality of independently controllable heater zones for the selective control based on the received input. Additionally or alternatively, in some embodiments, the thermal controller is configured to: determine whether one or more criteria are met, wherein the one or more criteria comprise a temperature of a device under test (DUT) being greater than a temperature threshold, a power of the DUT being greater than a power threshold, a heating-sensing element being shorted, or a heating-sensing element being an open circuit, wherein the selective control is based on the determination that the one or more criteria are met. Additionally or alternatively, in some embodiments, the selective control of the plurality of independently controllable thermal zones comprises activating at least one of the plurality of independently controllable heater zones including selecting a row and a column corresponding to the at least one heater zone. Additionally or alternatively, in some embodiments, the selective control of the plurality of independently controllable thermal zones comprises activating at least one of the plurality of independently controllable heater zones based on a pre-determined sequence. Additionally or alternatively, in some embodiments, the thermal controller further comprises: flash memory configured to store the pre-determined sequence. Additionally or alternatively, in some embodiments, the selective control of the plurality of independently controllable thermal zones comprises: activating one or more first independently controllable heater zones corresponding to one or more first devices under test (DUT) at a first time; and activating one or more second independently controllable heater zones corresponding to one or more second devices under test (DUT) at a second time. Additionally or alternatively, in some embodiments, the selective control of the plurality of independently controllable thermal zones comprises: activating the plurality of independently controllable heater zones based on an addressing scheme or stepping pattern. Additionally or alternatively, in some embodiments, the selective control of the plurality of independently controllable thermal zones comprises sequentially activating the plurality of independently controllable heater zones, the plurality of independently controllable cooling zones, or both. Additionally or alternatively, in some embodiments, the plurality of independently controllable heater zones is arranged as groups of heater zones, and the groups of heater zones are activated at the same time and determined by a user. Additionally or alternatively, in some embodiments, the plurality of independently controllable cooling zones is arranged as groups of cooling zones, and the groups of cooling zones are activated at the same time and determined by a user. Additionally or alternatively, in some embodiments, the thermal controller comprises: flash memory configured to store associations, wherein the plurality of independently controllable heater zones is arranged as groups of heater zones, or the plurality of independently controllable cooling zones is arranged as groups of cooling zones, and the associations are associations of the groups of heater zones or the groups of cooling zones. Additionally or alternatively, in some embodiments, the thermal controller is configured to: receive an input indicative of a power of a wafer under test (WUT); and determine a heater zone offset temperature based on the received input, wherein the selective control of the plurality of independently controllable thermal zones comprises adjusting a target temperature of at least one of the plurality of independently controllable heater zones. Additionally or alternatively, in some embodiments, the determining the heater zone offset temperature comprises multiplying a pre-determined constant factor by the power of the WUT. Additionally or alternatively, in some embodiments, the selective control of the plurality of independently controllable thermal zones comprises activating the plurality of independently controllable thermal zones by selecting a row and a column corresponding to the at least one heater zone.

A thermal control assembly (TCA) is disclosed. The TCA comprises: a plurality of independently controllable thermal zones comprising a plurality of independently controllable heater zones and a plurality of independently controllable cooling zones configured to maintain or change a temperature of a top surface of the TCA, wherein an energy input to the TCA is selectively applied to one or more of the plurality of independently controllable cooling zones. Additionally or alternatively, in some embodiments, the energy input to the TCA is selectively applied to two or more of the plurality of independently controllable cooling zones by a demultiplexer. Additionally or alternatively, in some embodiments, the energy input is a coolant fluid. Additionally or alternatively, in some embodiments, the TCA comprises: a thermal control wafer (TCW); and a coldplate comprising a plurality of channels configured to allow a coolant fluid to flow through to cool or maintain a temperature of the coldplate below a temperature of the TCW. Additionally or alternatively, in some embodiments, the TCA comprises: one or more thermal channels, wherein at least one of the one or more thermal channels comprises two or more of the plurality of independently controllable cooling zones. Additionally or alternatively, in some embodiments, the TCA comprises: a thermal control wafer (TCW) comprising the plurality of independently controllable heater zones; and a coldplate comprising the plurality of independently controllable cooling zones. Additionally or alternatively, in some embodiments, properties of the plurality of independently controllable heater zones are the same as properties of the plurality of independently controllable cooling zones, and the properties comprise number, size, and shape. Additionally or alternatively, in some embodiments, at least one property of the plurality of independently controllable heater zones is different from at least one property of the plurality of independently controllable cooling zones, the at least one property comprising number, size, or shape. Additionally or alternatively, in some embodiments, the plurality of the independently controllable heater zones is spatially aligned with the corresponding plurality of independently controllable cooling zones. Additionally or alternatively, in some embodiments, during an active period, a number of activated independently controllable cooling zones is equal to or greater than a number of activated independently controllable heater zones. Additionally or alternatively, in some embodiments, during an active period, an area of activated independently controllable cooling zones is equal to or greater than an area of activated independently controllable heater zones. Additionally or alternatively, in some embodiments, the TCA comprises: a coldplate comprising the plurality of independently controllable cooling zones; and a thermal control wafer (TCW), wherein the coldplate is disposed under the TCW. Additionally or alternatively, in some embodiments, the TCA comprises: a thermal control wafer (TCW); a coldplate; and a thermal interface material (TIM) located between the TCW and the coldplate, or between the TCW and a wafer under test (WUT). Additionally or alternatively, in some embodiments, the TIM comprises water. Additionally or alternatively, in some embodiments, the TIM comprises water, the TCA further comprising: a water-control element configured to remove the water from a surface of the TCW or from a surface of the coldplate. Additionally or alternatively, in some embodiments, the TCA comprise: a coldplate comprising separate cooling elements assembled into cavities in a coldplate member. Additionally or alternatively, in some embodiments, the separate cooling elements comprise fins that extend into the cavities when the separate cooling elements are assembled into the cavities. Additionally or alternatively, in some embodiments, the separate cooling elements are assembled into the cavities by brazing, soldering, diffusion bonding, friction stir welding, or adhesive attachment. Additionally or alternatively, in some embodiments, each of the cavities is associated with a coolant fluid flow control valve. Additionally or alternatively, in some embodiments, the associated coolant fluid flow control valve is electrically or pneumatically activated. Additionally or alternatively, in some embodiments, the associated coolant fluid flow control valve controls coolant fluid flow at an inlet or an outlet of the cavity. Additionally or alternatively, in some embodiments, the TCA comprises: a thermal control wafer (TCW) comprising pins disposed on an outside portion of the TCW, wherein the pins are configured to electrically couple one or more conductive layers of the TCW to a printed circuit assembly (PCA). Additionally or alternatively, in some embodiments, the pins of the TCW are configured to engage or disengage with connectors for assembly or disassembly, respectively. Additionally or alternatively, in some embodiments, the PCA comprises at least a portion of a thermal controller. Additionally or alternatively, in some embodiments, the TCA comprises: a thermal control wafer (TCW) comprising pins, wherein a number of the pins is equal to a number of thermal channels and a number of independently controllable thermal zones. Additionally or alternatively, in some embodiments, the TCA is arranged as a plurality of thermal channels, at least one of the plurality of thermal channels comprises two or more of the independently controllable heater zones or two or more of the independently controllable cooling zones, and each thermal channel is associated with a demultiplexer. Additionally or alternatively, in some embodiments, input to output ratios of the demultiplexers of the plurality of thermal channels are different for at least two of the plurality of thermal channels. Additionally or alternatively, in some embodiments, the TCA is arranged as a plurality of thermal channels, and the thermal channels have a power of 200 W or more. Additionally or alternatively, in some embodiments, the plurality of independently controllable heater zones and the plurality of independently controllable cooling zones are configured to maintain the temperature of the top surface of the TCA during machine vision alignment of the TCA or a wafer under test (WUT) to a wafer probe system. Additionally or alternatively, in some embodiments, the selectively applying the energy to one or more of the plurality of independently controllable cooling zones comprises activating the plurality of independently controllable cooling zones by selecting a row and a column corresponding to the at least one heater zone.

It will be appreciated that any of the variations, aspects, features, and options described in view of the systems and methods apply equally to the methods and vice versa. It will also be clear that any one or more of the above variations, aspects, features, and options can be combined. It should be understood that the invention is not limited to the purposes mentioned above, but may also include other purposes, including those that can be recognized by one of ordinary skill in the art.

Figure 1:
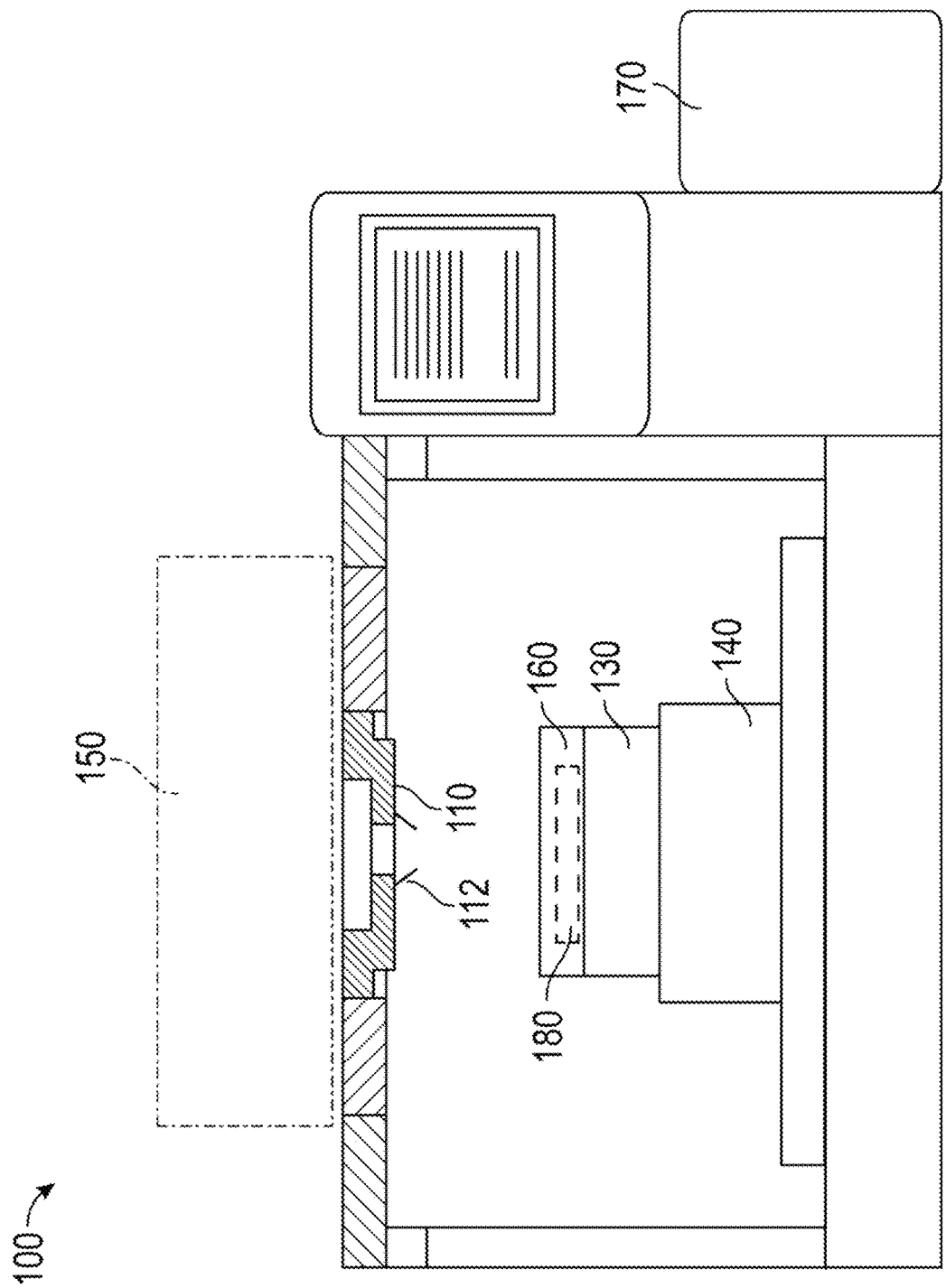
FIG. 1 illustrates a cross-sectional, schematic view of an example wafer probe test system, according to some embodiments.

It will be appreciated that any of the variations, aspects, features, and options described in view of the systems apply equally to the methods and vice versa. It will also be clear that any one or more of the above variations, aspects, features, and options can be combined.

DETAILED DESCRIPTION

Disclosed herein are systems and methods for controlling one or more temperatures using a thermal control assembly (TCA) and a coldplate. The TCA comprises independently controllable thermal zones for controlling its top surface temperature. The thermal zones may be heater zones, cooling zones, or both. Energy input to the TCA may be selectively applied by, e.g., a thermal controller, such that different sets of thermal zones receive the energy at different times. In some embodiments, the energy input to the TCA may be selectively applied to two more independently controllable heater zones at the same time, the energy input to the TCA may be selectively applied to two or more independently controllable cooling zones at the same time, or both. In some aspects, less than all thermal zones may be activated at the same time, providing a higher power density for the thermal zones for a given energy input to the TCA.

The following description is presented to enable a person of ordinary skill in the art to make and use various embodiments. Descriptions of specific devices, techniques, and applications are provided only as examples. These examples are being provided solely to add context and aid in the understanding of the described examples. It will thus be apparent to a person of ordinary skill in the art that the described examples may be practiced without some or all of the specific details. Other applications are possible, such that the following examples should not be taken as limiting. Various modifications in the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to a person of ordinary skill in the art, that one or more aspects and/or features described or referenced herein may be practiced without some or all of these specific details. In other instances, well-known process steps and/or structures have not been described in detail in order to not obscure some of the aspects and/or features described or referenced herein.

In the following description of examples, reference is made to the accompanying drawings which form a part hereof, and in which it is shown by way of illustration specific examples that can be practiced. It is to be understood that other examples can be used, and structural changes can be made without departing from the scope of the disclosed examples.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/of" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that the term "same," when used in this specification, refers to the stated feature as being identical or within a certain range (e.g., 1%, 5%, etc.) from identical.

FIG. 1 illustrates a cross-sectional, schematic view of an example wafer probe test system. The wafer probe test system 100 comprises a probe card 110, a chuck base 130, a moving mechanism 140, a test head 150, a thermal control assembly (TCA) 160, and a chiller 170. The TCA 160 may comprise a thermal controller 180. Although FIG. 1 illustrates a thermal controller 180 incorporated within the TCA 160, the thermal controller may be physically separate from but electrically coupled to the TCA 160. The probe card 110 comprises a plurality of probes 112 for electrically coupling electrical pads formed on a wafer under test (WUT). The WUT may be placed on top of and temporarily secured by the TCA 160 using, e.g., vacuum. The TCA 160 may be located between the WUT and the chuck base 130 during testing. The moving mechanism 140 may move the chuck base 130 and TCA 160 along one or more axes, such as in three dimensions along x, y, z, and/or rotational θ axes. The moving mechanism 140 may comprise alignment mechanisms such as cameras, for aligning the WUT and/or IC devices formed on the WUT with the probes 112 on the probe card 110.

Figure 2:
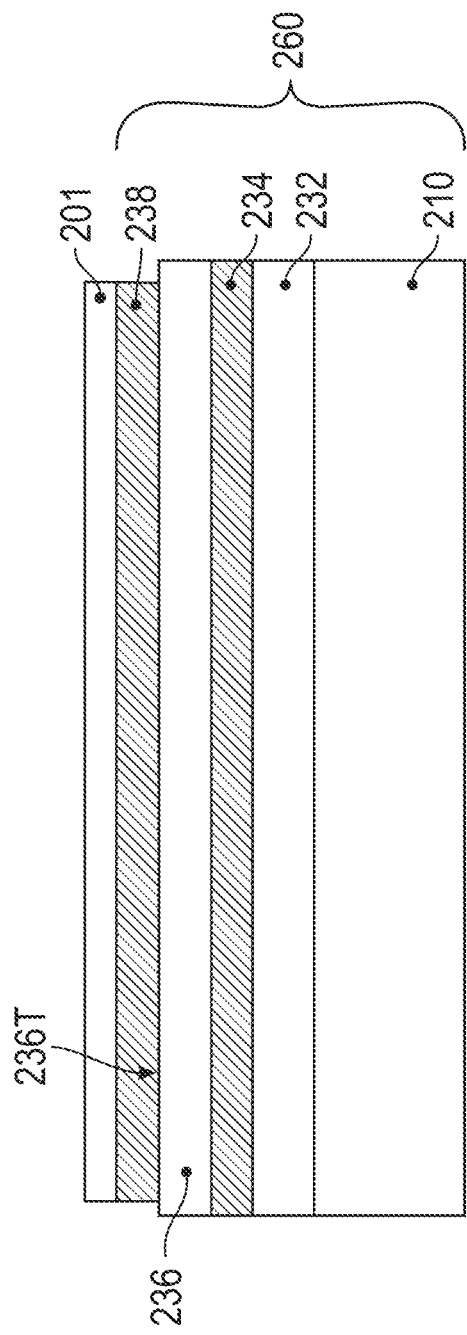
FIG. 2 illustrates a cross-sectional, schematic view of an example TCA, according to some embodiments.

In some embodiments, the wafer probe test system 100 may comprise a TCA 160. FIG. 2 illustrates a cross-sectional, schematic view of an example TCA 260, according to some embodiments. TCA 260 may be similar to TCA 160 of FIG. 1. The TCA 260 may comprise a TCA base 210, a coldplate 232, thermal interface material (TIM) 234, a TCW 236 and another TIM 238. A WUT 201 may be placed on top of and temporarily secured by the TCA 260 during testing. The TCA base 210 may be located at the bottom of the TCA 260, e.g., furthest from the WUT 201 and closest to a chuck base (e.g., chuck base 130 of FIG. 1) relative to the other components within the TCA 260. The moving mechanism 140 may move the chuck base 130 and the TCA 260 in the x, y, z, and/or rotational θ directions. The TCA 260 may comprise a TIM 238 between TCW 236 and the WUT 201. In some embodiments, a TIM 234 may be located between the coldplate 232 and the TCW 236. The TCA 260 may be located between the WUT 201 and a chuck base 130, which may be arranged on the moving mechanism 140 during testing.

Controlling one or more heater zones on the TCW 236 and/or one or more cooling zones on the coldplate 232 may control the temperatures of one or more DUTs during testing. In some aspects, the control may be a selective control, controlling less than all of the heater zones and/or cooling zones based on one or more selections. In some embodiments, the number of heater zones of the TCW 236 and the cooling zones of the coldplate 232 are the same. In some embodiments, the size and/or shape of the heater zones of the TCW 236 may be the same as the cooling zones of the coldplate 232. Additionally or alternatively, the heater zones of the TCW 236 may be spatially aligned with each other. In some cases, the number, size, and/or shape of the heater zones of the TCW 236 are different than the cooling zones of the coldplate 232, and the heater zones and cooling zones may or may not be spatially aligned.

The configuration and arrangement of the TCA 260 may vary depending on one or more factors such as the wafers to be tested (WUT) or the prober test system 100. In some cases, the TCA 260 does not include a coldplate 232, as the wafers to be tested may not be actively cooled (e.g., by a coldplate). In some cases, the TCA 260 does not include the TIM 234, as the thermal coupling between the coldplate 232 and TCW 236 is sufficient when they are placed adjacent to each other. In some cases, the TCA 260 does not include the TIM 238, as the thermal coupling between the TCW 236 and WUT 201 may be sufficient when they are placed adjacent to each other.

The TCA 260 may be removably attached to the chuck base 130. For example, when a first TCA 260 is used to support testing of a first set of wafers, it is affixed to the chuck base 130 and held in place (e.g., by vacuum or other means). When the first TCA 260 (suitable for a first set of wafers) is no longer used, the first TCA 260 can be removed and replaced with a second TCA 260 (suitable for a second set of wafers). In some cases, one or more TCAs 260 can be stored within the prober system, such as in a storage drawer, and changing from a first TCA 260 to a second TCA 260 can be partially or wholly automated within the prober test system.

In some embodiments, the TCW 236 comprises a plurality of dielectric layers. A dielectric layer comprises a dielectric material such as ceramic, glass-ceramic, glass, an organic dielectric material, an inorganic dielectric material, or any other suitable dielectric material. One example dielectric material is aluminum nitride (AlN). In some embodiments, conductive traces or pads may be patterned on one or more of the dielectric layers, such as by thick film paste or ink screen printing, thin film deposition, or any other suitable method. In some embodiments, a dielectric layer comprises openings for forming one or more vias. A via may be filled with a conductive material that electrically couples one conductive layer to another conductive layer in the TCW 236. Although FIG. 2 represents TCW 236 as a monolithic substrate (e.g., comprised of multiple material layers) that spans the whole width and area of the semiconductor wafer 201 that comprises the WUT, this is only one example of how the TCW 236 may be configured. In some cases, the TCW 236 may be configured by combining two or more smaller substrates in order to span the whole width and area of the WUT. Combining two or more smaller substrates means any method or configuration of combining the substrates to cover the whole area of the WUT, such as a physical connection, placing the smaller substrates adjacent to each other on a support structure, or any other method or configuration.

Figure 3:
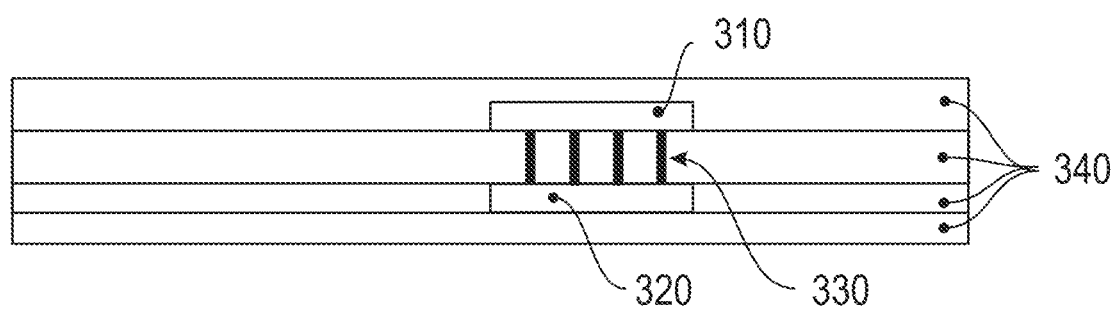
FIG. 3 illustrates a cross-section view of an example upper conductive element, such as a trace, and a lower conductive element embedded within dielectric layers, according to some embodiments.

To increase yield and reliability, in some embodiments, the TCW 236 comprises multiple vias electrically coupling the same layers, as shown in FIG. 3. FIG. 3 is an example cross-section view of an upper conductive element 310, such as a trace, and a lower conductive element 320 embedded within dielectric layers 340. Multiple vias 330 may electrically couple the upper conductive element 310 to the lower conductive element 320. If one or more of the multiple vias 330 electrically fail, one or more other vias 330 may provide electrical coupling. The TCW 236 can be constructed as green sheets of dielectric material with associated conductive layers that are stacked and then cofired together in either a low temperature or high temperature process to form a hard ceramic or glass-ceramic structure or a metal-based structure with inorganic dielectric layers.

In another embodiment, a first metal layer, such as an aluminum or stainless-steel layer, forms a base material, and a dielectric layer is formed on the first metal layer. Additional conductive layers and dielectric layers may be formed on the base material (first metal layer), similar to as described above. Metal may have a higher thermal conductivity than a dielectric material, so the base material may comprise metal instead of a dielectric material (e.g., ceramic AlN).

The TCW 236 may comprise one or more heaters, wherein a heater may comprise a resistive trace that may emit thermal energy (heat) when a voltage differential is applied across its terminals due to Joule heating. The TCW 236 may be divided into one or more heater zones that can be independently controlled. One or more (e.g., each) heater zone may comprise at least one heater. For example, one heater zone may comprise multiple heaters. The heaters can be arranged so that they are independently electrically coupled, and/or two or more heaters are electrically coupled in series or in parallel. In some embodiments, the heaters may be located on a single conductive layer so that they are close to the top of the TCW 236, and thereby close to the WUT 201. In some embodiments, the heaters may be located on two or more conductive layers in the TCW 236. In some embodiments, the TCW 236 comprises a shield layer located between the WUT 201 and the heaters (described in more detail below).

One aspect in the configuration of a TCW 236 is the number of independent electrical connections to the TCW 236. In some prober systems, the space available (vertically, horizontally, and/or radially) at or proximate to the chuck base 130 may be limited. This limited space may make it difficult to route a large number of electrical connections to the TCW 236. In other words, it is advantageous to minimize the number of connections to the TCW 236 if possible. In thermal control systems for electrical testing, resistance temperature devices (RTDs) or other temperature measurement devices such as thermocouples may be used for measuring the temperature of a heater, heater zone, and/or heater assembly. In some instances, it is desirable to have a temperature measurement sensor (e.g., RTD) for each heater zone.

Figure 4:
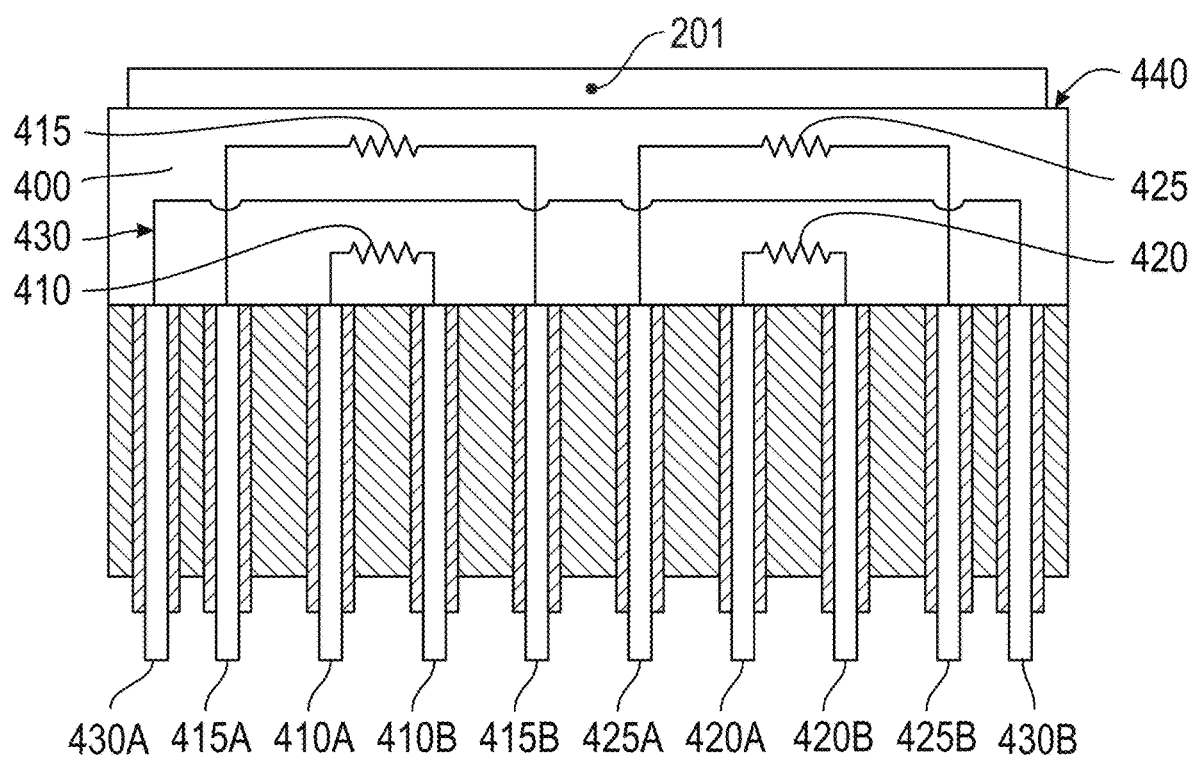
FIG. 4 illustrates a cross-sectional view of an example TCA comprising a plurality of heater zones, according to some embodiments.

FIG. 4 shows a cross-sectional view of an example TCW 236 comprising a plurality of heater zones. A first heater zone comprises a first resistive heater 410 and a first temperature measurement device 415, and a second heater zone comprises a second resistive heater 420 and a second temperature measurement device 425. In some embodiments, a shield layer 430 is configured to shield the first and second resistive heaters 410 and 420 from a WUT 201. The WUT 201 may be adjacent to surface 440 of the TCW 236. Heaters 410 and 420, temperature measurement devices 415 and 425, and shield layer 430 are conductive elements and may be embedded in a dielectric material 400. The heaters 410 and 420, temperature measurement devices 415 and 425, and shield layer 430 may communicate with a thermal controller 180 or elements of a wafer probe test system via electrically coupled pins. For example, FIG. 4 shows pins 430A and 430B electrically coupled with the shield layer 430. The shield layer 430 may be electrically coupled to ground.

Although FIG. 4 shows two pins 430A and 430B, embodiments of the disclosure may include any number of pins (one, three, or more) for coupling the shield layer 430 to ground. Any number of pins, but a minimum of two pins, is required for communicating signals to and/or from a thermal controller 180 and/or a power supply to the heaters 410 and 420 and the temperature measurement devices 415 and 425. For example, the resistive heaters 410 and 420 in FIG. 4 may each comprise two pins 410A and 410B and two pins 420A and 420B, respectively. In some embodiments, pins 410A, 410B, 420A, and 420B may be used for electrically coupling a voltage potential across the resistive heaters 410/420, allowing current to flow through the resistive heaters 410/420. The first resistive heater 410 is coupled to the first set of pins 410A and 410B, and the second resistive heater 420 is coupled to second set of pins 420A and 420B. Temperature measurement devices (RTDs, thermocouples, diodes, etc.) may use at least two electrical connections, and therefore at least two pins. The first temperature measurement device 415 is coupled to pins 415A and 415B, and the second temperature measurement device 425 is coupled to pins 425A and 425B. In some embodiments, a thermal control structure comprising two heater zones uses eight pins 415A, 415B, 425A, 425B, 410A, 410B, 420A, 420B and two conductive layers for heating and temperature measurement.

Figure 5:
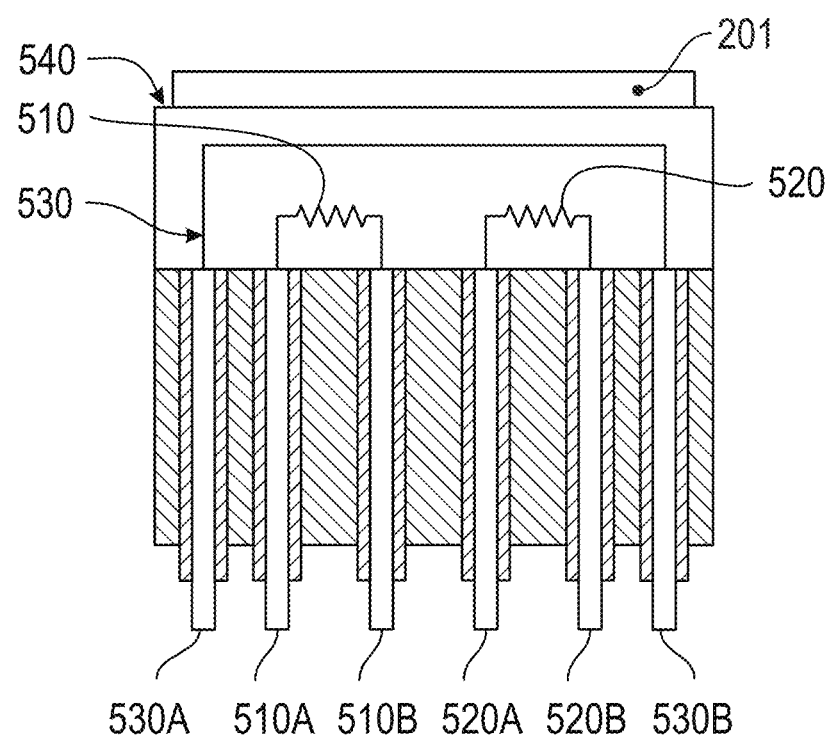
FIG. 5 illustrates a cross-sectional view of an example TCW comprising a first heater zone that includes a first heating-sensing element and a second heater zone that includes a second heating-sensing element, according to some embodiments.

As shown in FIG. 5, the number of pins and/or the number of conductive layers used in the temperature measurement devices and heaters can be reduced (e.g., compared to the thermal control structure of FIG. 4). This reduction in the number of pins and the number of conductive layers may be due to using the same resistor for both heating (through Joule heating) and for measuring the temperature (through the Temperature Coefficient of Resistance (TCR) associated with the resistive trace material). In other words, the thermal control structure may use heating-sensing elements instead of discrete heaters and discrete temperature measurement devices.

FIG. 5 shows a cross-sectional view of an example TCW 236 comprising a first heater zone that includes a first heating-sensing element 510 and a second heater zone that includes a second heating-sensing element 520. Each heating-sensing element 510 or 520 may use two electrical connections, for example. During a time period when the corresponding heater zone is being heated (heating mode), heating-sensing elements 510 and 520 provide heat to the respective heater zone by Joule heating. During a time period when it is desirable to measure the temperature of the corresponding heater zone (sensing mode), heating-sensing elements 510 and 520 may have a resistance that varies according to their temperature as defined by the Temperature Coefficient of Resistance (TCR) of their constitutive material. The measured resistance can be used to determine the temperature of the heater zone based on calibration data (e.g., resistance versus temperature pre-determined for each heating-sensing element). In other words, during sensing mode, the operation of the heating-sensing elements 510 and 520 may be similar to RTDs.

As shown in FIG. 5, the first heating-sensing element 510 may use two pins 510A and 510B, and the second heating-sensing element 520 may use two pins 520A and 520B. In some instances, the first and second heating-sensing elements 510 and 520 can be constructed in a single conductive layer in the TCW 236. In some embodiments, the TCW 236 comprises a shield layer 530 that shields the heating-sensing elements 510 and 520 from a WUT 201 adjacent to surface 540 of TCW 236). As shown in FIG. 5, the shield layer 530 may be coupled to pins 530A and 530B. The reduced number of pins and traces may simplify and reduce the costs for wiring of the TCW 236. Additionally, the reduced number of layers required for heating and temperature measurement may result in reduced thickness and mass for the TCW 236. A reduced mass for the TCW 236 allows it to change temperature quicker, reducing idle time for the wafer tester while it is waiting for the WUT to transition from one set point temperature to another. A reduced thickness for the TCW 236 allows reduced thermal resistance from the top side of the TCW 236 to the bottom side. This reduced thermal resistance translates directly to the reduced thermal mass of the TCW 236.

During sensing mode, a heating-sensing element may use a 4-wire connection comprising two connections for a forcing current signal and two connections for voltage sensing across the heating-sensing element. The TCW 236 of FIG. 5 comprises two pins for each heating-sensing element 510 and 520, and would be able to accommodate a 4-wire connection and measurement. The pins may be attached to two wires or to two traces on a printed circuit assembly (PCA). In some embodiments, the TCW 236 may comprise the traces for a 4-wire connection (discussed below with respect to FIG. 6).

To achieve sufficiently high resistance to generate the desired heat during heating mode, the heating-sensing elements may have a relatively narrow trace width. In some aspects, other traces (e.g., non-heating-sensing elements) that electrically couple to the heating-sensing elements (e.g., heating-sensing elements 510 or 520) may be substantially wider than the traces that comprise the heating-sensing elements. The non-heating-sensing elements may be, e.g., 5 times wider, 10 times wider, etc. than the traces that comprise the heating-sensing elements. The non-heating-sensing element may be configured to minimize heat through Joule heating and/or may be used where a low resistance is desired.

In some embodiments, the traces that comprise the heating-sensing elements may comprise a material that has a higher electrical resistivity than the traces used for routing power, or for supplying a forcing current and/or sensing voltage of the heating-sensing elements (which may use a higher electrical conductivity material). While the traces that comprise the heating-sensing elements are intended to create heat during a heating time period, in some instances, it may not be desirable for the routing traces to heat up during use (a low resistance may be desirable). The material for the traces that comprise the heating-sensing elements may have a resistivity that is two times, three times, four times, etc. greater than the higher electrical conductivity material. In some embodiments, wiring traces that are used for interconnection and that are not intended to contribute to the heating of heater zones have a resistance that is 1% or less of the overall trace resistance when the traces that comprise the heating-sensing elements are included.

Figure 6A:
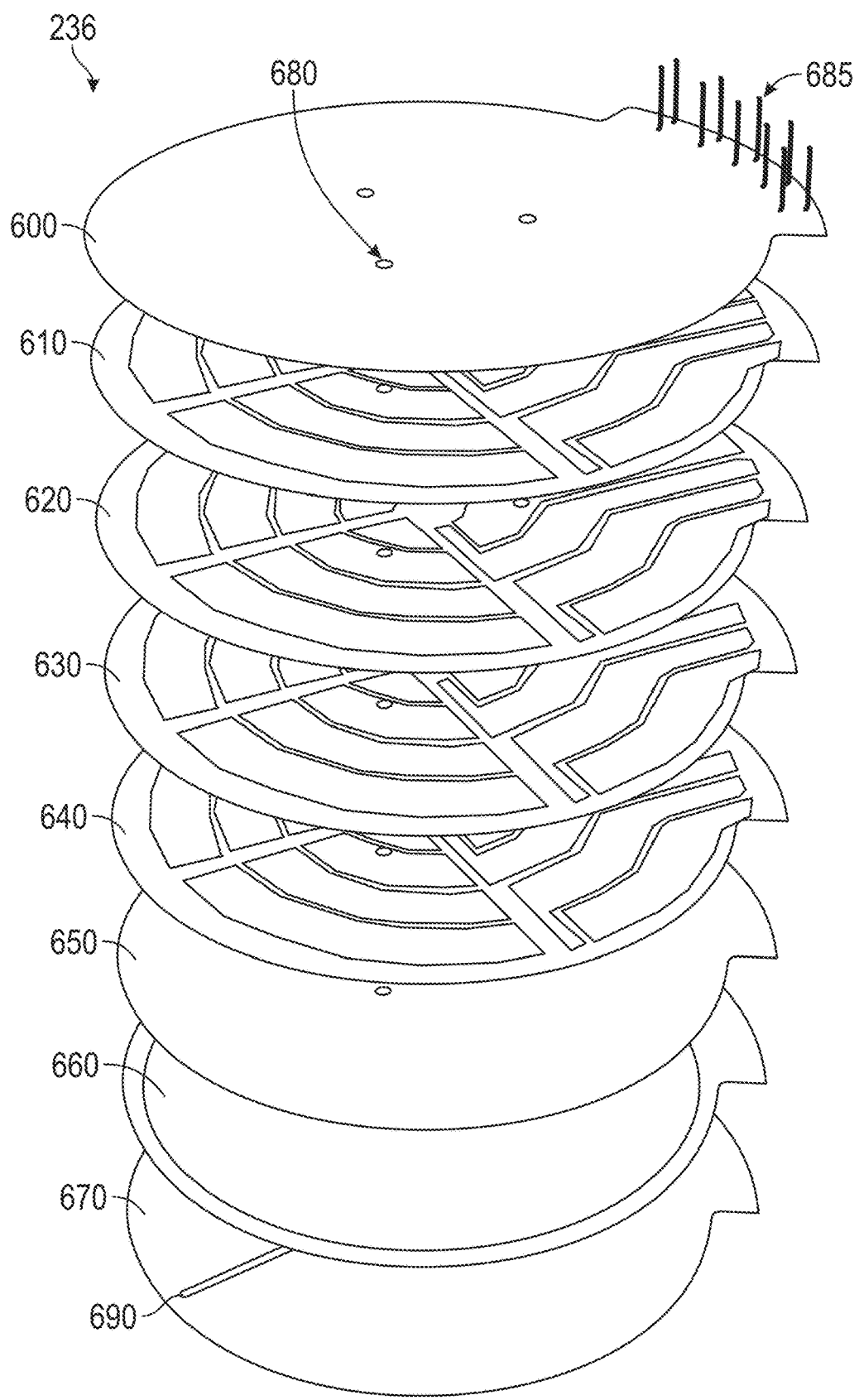
FIG. 6A illustrates an exploded view of an example layer-by-layer construction of a TCW, according to some embodiments.

FIG. 6A shows an exploded view of an example layer-by-layer construction of a TCW 236. In a wafer probing application, a TCW 236 may have a circular shape. The TCW 236 may have a diameter or perimeter larger than the diameter or perimeter, respectively, of a WUT. For example, the TCW 236 may have a diameter of 320 mm for a corresponding 300 mm diameter WUT. In some embodiments, the size of the circular area of the TCW 236 may correspond to the size of the semiconductor wafer 201 to be tested. For example, the diameter or perimeter of the circular area of the TCW 236 may be substantially the same as the diameter or perimeter, respectively, of the semiconductor wafer 201 including, but not limited to, 150 mm, 200 mm, 300 mm, etc. In some cases, the diameter of the TCW 236 is between 1 and 1.3 times the diameter of the WUT. In some embodiments, the TCW 236 may be larger than a single semiconductor wafer 201 and may be capable of accommodating one or more smaller semiconductor wafers 201. In some embodiments, the thickness of the TCW may be less than 3 mm. In instances, where the TCW 236 accommodates one or more smaller semiconductor wafers 201, the vacuum channels 690 (shown in FIGS. 6A and 9A) may be located according to the size and/or shape of the semiconductor wafer(s) 201 such that there are no vacuum leaks when the TCW 236 is temporarily secured to the semiconductor wafer(s) 201. In some embodiments the WUT may comprise a wafer that has been singulated into individual chips that are attached to a supporting film and frame.

Figure 6B:
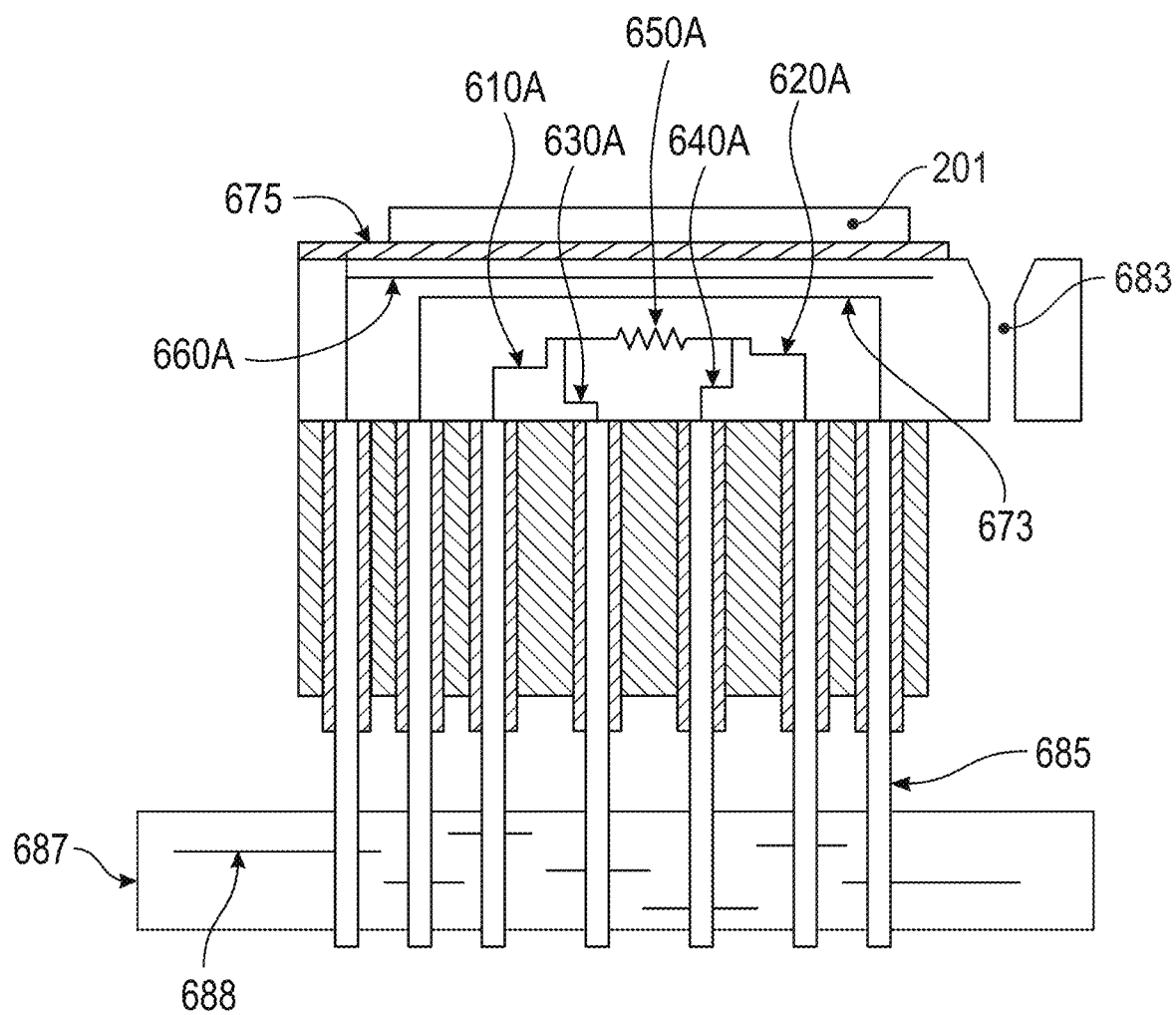
FIG. 6B illustrates an example TCW and PCA, according to some embodiments.

Although the TCW 236 may be generally circular in shape, it may have other features such as protrusions from its edge to provide area for pins to be attached (shown in FIG. 6A) or for mechanical attachment points 683 (shown in FIG. 6B). The example TCW 236 shown in FIG. 6A has eight layers, but a TCW 236 may be constructed with fewer layers, such as 4 layers, with more layers such as 12 layers, or with any number of layers that is appropriate for the configuration of a particular TCW 236. The image in FIG. 6A is oriented to show the metal layers. When mounted on a prober chuck base, the TCW would be flipped over such that layer 600 is resting on the top of the chuck base and the pins 685 are oriented downward.

TCW 236 comprises a dielectric layer 600 as an outermost layer. Layer 600 may include channels 690 within its surface that function with a vacuum source to help hold the TCW 236 to the rest of a TCA 160 or to a chuck base 130. Pins 685 attach to pads on an outer conductive layer, such as layer 610. The pins 685 may be attached by brazing, soldering, or other methods. The pins 685 may be covered by a condensation control cover and/or electrical insulation or otherwise encased. The TCW 236 and its pins 685 are configured such that they do not physically interfere with the rest of the chuck base (such as a coldplate or other layer). The pins 685 may attach to a PCA 687 (shown in FIG. 6B) that includes a thermal controller 180. In some embodiments, TCW 236 comprises fewer pins 685, which allows for greater spacing between pins 685 and/or easier assembly. As described previously (and shown in FIG. 3), vias can pass through the dielectric layers (e.g., dielectric layer 600) to electrically couple two or more conductive layers together (e.g., conductive layer 610 coupled to conductive layer 650). Holes, such as hole 680, may extend through the full thickness of TCW 236. The holes 680 may accommodate lifter pins, or air blow-off ports. The lifter pins may be used to extend through holes in various layers of the chuck base. In a chuck base that includes a coldplate 232 and a TCW 236, the holes may extend through both the coldplate 232 and TCW 236. The lifter pins would vertically align with the holes 680, and during an unloading operation for a WUT, would lift the WUT away from the surface of the TCW 236.

The example TCW 236 of FIG. 6A shows a configuration, where the TCW 236 has the 4-wire measurement capability for the heating-sensing elements internal to the TCW 236. Layers 610 and 620 may comprise wiring interconnects for a force current input and output to one or more (e.g., each) heating-sensing elements. Layers 630 and 640 may comprise wiring interconnects for a voltage sensing input and output for one or more (e.g., each) heating-sensing elements.

Layer 650 includes the traces for the heating-sensing elements, such as heating-sensing element 650A shown in FIG. 6B. In this case, heating-sensing element 650A is configured for 4-wire measurement with traces 610A and 620A supplying a force current and traces 630A and 640A measuring the voltage across the heating-sensing element 650A during a period of time when the resistance of the heating-sensing element 650A is measured. Layer 660 may be a shield layer comprising a shield (the darker material shown in FIG. 6A, or the shield 660A shown in FIG. 6B). The shield 660A may extend substantially over the whole area of the TCW 236. The shield may be connected to ground, such as ground layer 688 of PCA 687 as shown in FIG. 6B. Although the conductive shield on layer 660 is shown as a solid layer, it may also comprise multiple pieces or be arranged as a mesh. The shield layer, formed as a solid plane or as a mesh, that covers substantially the whole surface of the TCW 236 (except where vias, holes or other elements are present) acts to attenuate electromagnetic noise generated by switching on and off the heating-sensing elements that could interfere with the electrical testing of the WUT.

Layer 670 is an outermost dielectric layer and has channels supplying vacuum so that a WUT can be held in place on the TCW 236. The outermost dielectric layers 600 and 670 may be planarized through grinding, lapping, polishing, or other operation. A smooth and flat outer surface may help make good contact for holding vacuum between the TCW 236 and the WUT, or the rest of the chuck base. In some embodiments, one or both of the outer surfaces may have an average surface roughness Ra of 0.8 microns or less, and a flatness of 25 microns or 10 microns over a 300 mm diameter. In some embodiments, the outer surfaces of the TCW 236 may be planarized, improving the contact surface area between the surface and reducing the need for a TIM between the TCW 236 and the WUT or the rest of the chuck base.

The outermost layer (e.g., closest to the WUT), dielectric layer 670, or an additional outermost layer (dissipative layer 675 shown in FIG. 6B), may form a dissipative layer that is grounded, such as to ground layer 688 of PCA 687, to allow electrostatic charges that may be formed on the surface of the TCW 236 to be dissipated to ground. The dissipative layer may be formed by altering the formulation of the dielectric material of dielectric layer 670 itself or may be a dissipative layer 675, applied to dielectric layer 670, such as a conductive polymer layer, or a metal or other conductive material layer. An electrostatic dissipative layer has a resistance between $10^4$ and $10^{11}$ ohms. In some cases, layer 675 can be a conductive layer formed by atomic layer deposition (ALD), physical vapor deposition (PVD), chemical vapor deposition (CVD), electroless plating, or the like. A conductive layer may have a resistance below 10 Ohms, or in some cases below 5 ohms. The dissipative layer 675 may have a connection to ground or some other desired electrical potential that is selectively electrically coupled to either open or closed depending on the state of WUT testing. For example, during testing of the WUT the connection to ground may be open, while at other times the connection would be closed.

The TCW 236 may also include a conductive layer 673 (shown in FIG. 6B), or the shield layer 660 may also function as an electrostatic chuck to assist with holding the WUT in place during testing. By applying an appropriate voltage differential between the WUT 201 and a conductive layer in the TCW 236, an attractive Coulomb force can be created between the two.

Figure 7:
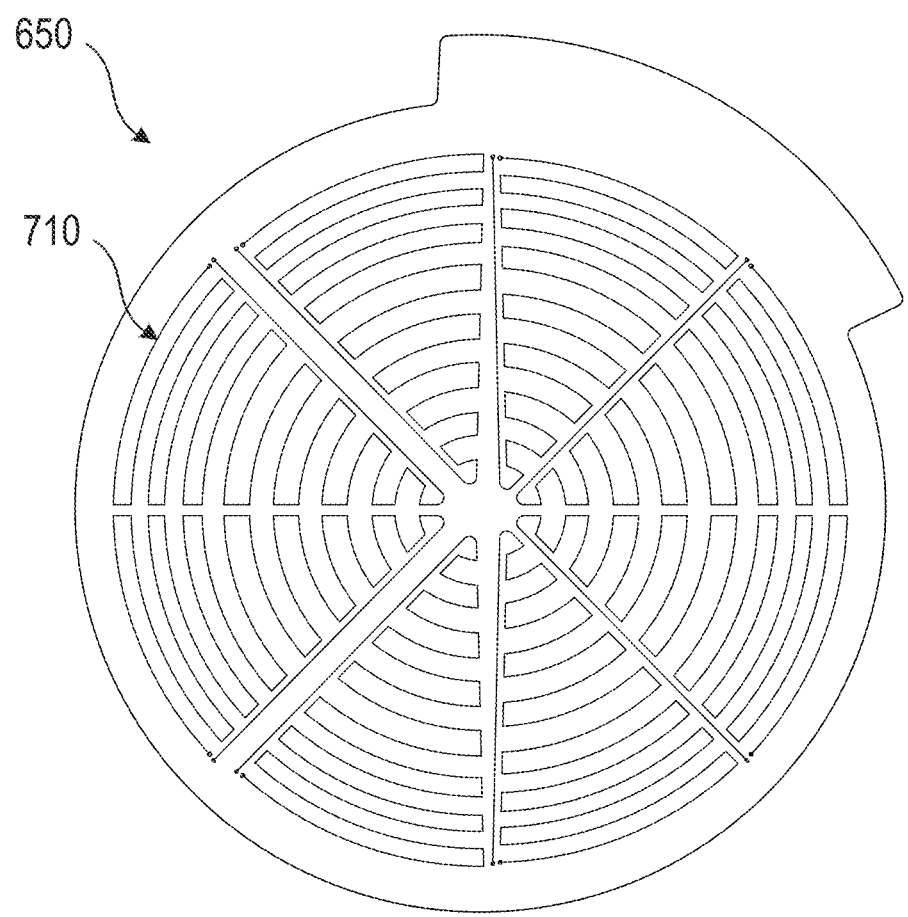
FIG. 7 illustrates a more detailed view of an example heating-sensing layer, according to some embodiments.

FIG. 7 is a more detailed view of the heating-sensing layer 650 shown in FIG. 6A. FIG. 7 shows eight heater zones arranged as octants within the TCW 236. An exemplary heating-sensing element 710 is depicted that comprises a single trace. The trace that comprises heating-sensing element 710 covers substantially the whole area of its heater zone and is configured to provide a uniform power density over its heater zone area. As previously noted, the traces that comprise heating-sensing elements are relatively narrow so that their resistance is high, and they are efficient at converting electrical power to heat energy. The width and length of a trace that comprises a heater-sensing element, such as heating-sensing element 710, may depend on one or more factors including, but not limited to, the desired heat output (power), the power supply voltage, the current-carrying capability of the trace, the desired power density, the number of heater zones, the number of heating-sensing elements, the number of channels that the control system can provide and control, etc.

In some instances, at different time periods, the same trace that comprises heater-sensing element, such as heating-sensing element 710, acts either as a heater or a temperature sensing element. This arrangement may lead to better accuracy compared to the heater and temperature sensor being two separate elements. Furthermore, if a thermal controller 180 can measure the temperature quickly and at a high frequency then the stability of the temperature of the heater zone or the whole TCW 236 can be well-controlled (e.g., within ±0.1° C.).

Although FIG. 7 shows a TCW 236 with heater zones arranged as octants, examples of the disclosure include different configurations of the heater zones. In some cases, a heater zone can be configured for each chip on a WUT. In some cases, a heater zone may be configured for groups of chips on a wafer. In some cases, a single chip on a wafer may comprise two or more heater zones. In the cases where the heater zones have some relation to the layout of chips or groups of chips on the WUT, the heater zones may tend to be arranged in an orthogonal array. TCWs 236 that have heater zones that are configured in accordance with the chip layout on the WUT may be used more universally with WUTs having different chip layouts. Although FIG. 7 shows heater zones arranged in octants, examples of the disclosure may include, but are not limited to, any configuration with, e.g., a polar or radial configuration of heater zones or orthogonal arrays of heater zones. The configuration may not be defined according to the chip layout on the WUT 201, allowing the heater zones to be used for testing WUTs with any chip layout. In some embodiments, the associations of groups of heater zones and/or groups of cooling zones may be stored in flash memory.

Each heater zone may comprise one or more heater-sensing elements and may be configured to set or maintain a temperature above the temperature of a thermally coupled coldplate or corresponding cooling zone. In some embodiments, the heater zones may be configured as independently controllable heater zones.

In some embodiments, the areas of the heater zones and the power dissipation within the heater zones are configured so that there is the same power density in all the heater zones on a TCW 236. The power density capability during heating can be, for example, as high as 0.5 W/mm² or as high as 0.65 W/mm², or in other cases higher or lower.

In some aspects, the heating-sensing element (e.g., heating-sensing element 710*he*) being both the heater and temperature sensing element allows for creating additional failure modes. For example, a failure in the temperature sensor that is separate from the heater may not be recognized as a failure, and corrective actions may not be taken to adjust the output of the heater. Furthermore, heating-sensing elements (configured as both the heater and the temperature sensing element) may produce less electrical noise (compared to the heater and temperature sensing elements being separate elements). Less noise in the thermal control system may lead to more accurate thermal control.

Figure 8:
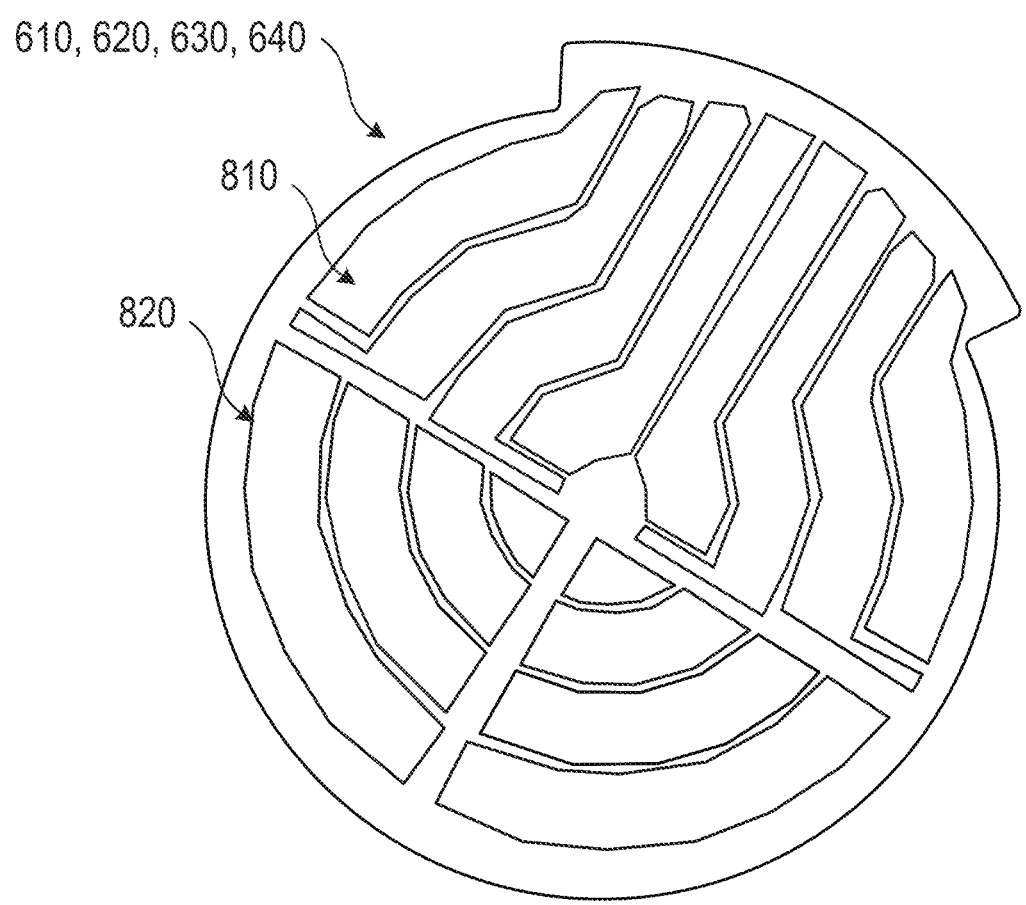
FIG. 8 illustrates an example wiring interconnect layer within a TCW, according to some embodiments.

FIG. 8 depicts an example of a wiring interconnect layer within the TCW 236, such as layer 610, 620, 630 or 640 of FIG. 6. The TCW 236 of FIG. 6 may be configured for a "4-wire" connection to one or more (e.g., each) heating-sensing element, such as heating-sensing element 710. These four connections (e.g., one for positive force current, one for negative force current, one for positive voltage differential measurement, and one for negative voltage differential measurement) may be active during the sensing mode (a time period when the resistance of the heating-sensing element is being measured so that the thermal controller 180 can establish the temperature of the heating-sensing element). In the example configuration shown in FIG. 6, each of the four connections may be routed on a separate conductive trace. As shown in FIG. 8, these trace interconnects, such as trace interconnect 810, are substantially wider than the traces that comprise the heating-sensing elements, such as heating-sensing element 710, shown in FIG. 7.

Some ceramic, glass-ceramic, or other inorganic dielectric materials undergo shrinkage when they are fired, and their constituent particles are sintered together to form a solid material. Shrinkage can be on the order of 20% and can lead to a poor final product if the shrinkage is not uniform throughout the part. One way to help ensure uniform shrinkage is to balance the amount of conductive material on each layer so that both the amount of conductive material per unit area and the distribution of the conductive material over the area is uniform. There are eight interconnect traces depicted in FIG. 8, such as interconnect trace 810. For some configurations, electrically active interconnect traces 810 occupy a portion (e.g., approximately half) of the surface area of the wiring interconnect layer. To balance the configuration, other portions of the surface of the wiring interconnect layer may comprise dummy fill areas, such as the eight dummy fill areas 820. The dummy fill areas 820 may not be electrically connected. In some embodiments, the dummy fill areas 820 are used to balance the conductive layer configuration so that uniform shrinkage occurs during firing of the TCW 236.

Figure 9A:
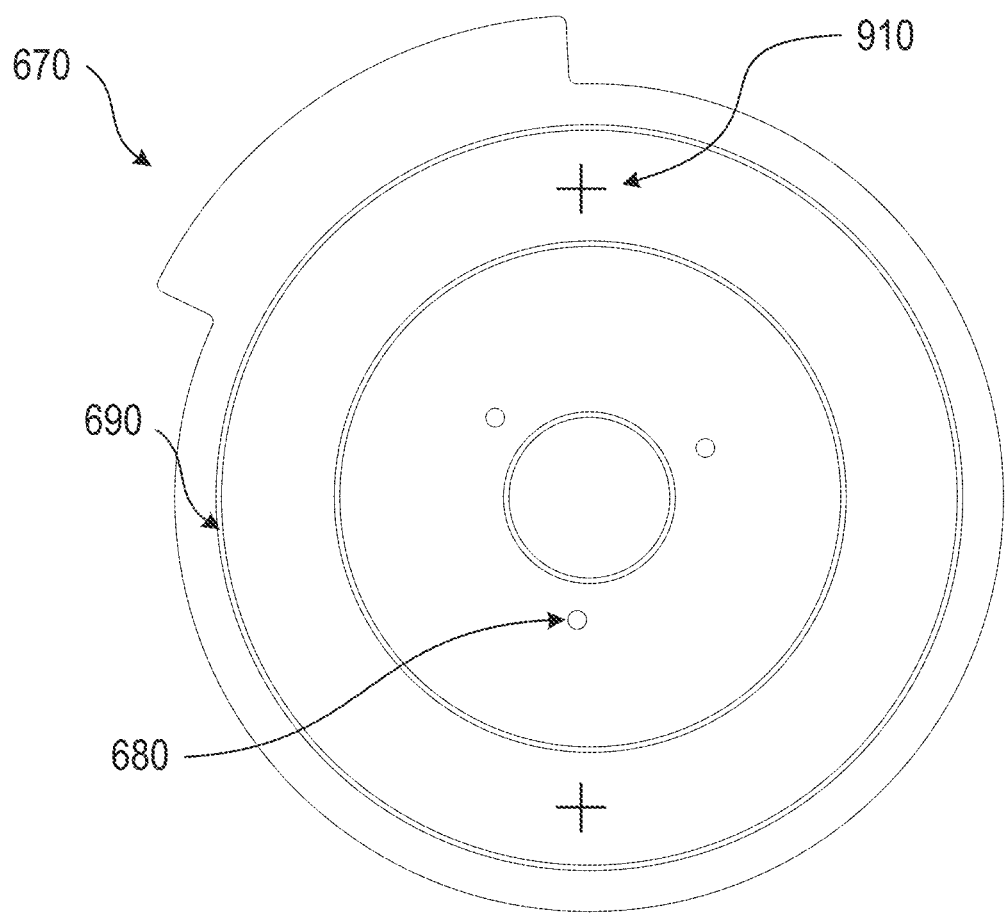
FIG. 9A and FIG. 9B illustrate example layers of a TCW, according to some embodiments.
Figure 9B:
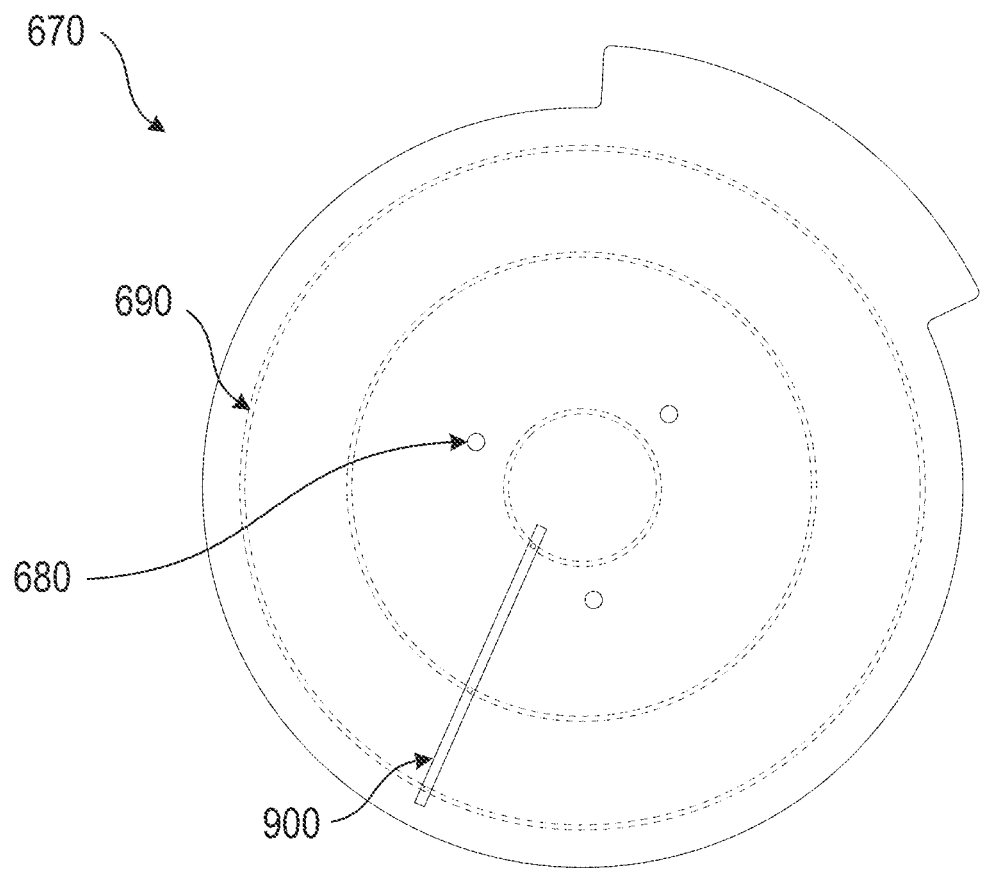

FIG. 9A and FIG. 9B depict the outermost dielectric layer of the TCW 236, layer 670 of FIG. 6. FIG. 9A depicts the side of layer 670 that would be, e.g., adjacent to the WUT during testing. Layer 670 comprises vacuum channels 690 and through holes 680, as previously described. The surface of TCW 236 depicted in FIG. 9A may also include one or more fiducials 910 to allow the wafer probe test system to optically determine the position of the TCW 236 so that the WUT 201 can be properly aligned to the TCW 236 and the chuck base.

FIG. 9B depicts the side of layer 670 that would face the chuck base. Notably FIG. 9B shows a vacuum groove or channel 900 that is of a different configuration than the vacuum channels 690 on the opposite side of this layer. Vacuum groove or channel 900 may be configured to couple to a vacuum port in the chuck base. In some embodiments, since the vacuum groove or channel 900 may only need to couple to the vacuum channels 690 on the opposite side of the layer 670, its configuration may be simpler (such as a straight line as shown in the figure). Communication from the vacuum groove or channel 900 to the vacuum channels 690 is provided by small through holes in the dielectric layer 670 that align with the vacuum channels 690 and 900. In some embodiments, there may be different vacuum channels on the top surface and bottom surface.

The dielectric layer 600 is oriented towards the chuck base. In some cases, as depicted in FIG. 2, a TIM 234 is located between dielectric layer 600 of the TCW 236 and the chuck base, which may include a coldplate 232. In some cases, a TIM is used to increase thermal conductivity so that there is low thermal resistance between the elements it is located between. In some cases, a TIM is used to reduce its thermal conductivity so that there is a higher thermal resistance between the elements it is located between, in order to increase the amount of thermal isolation between the thermal control wafer and the chuck. In some instances, an IC chip may be tested at a plurality of set point temperatures, so the wafer probe test system may change the temperature of one or more IC chips from a first set point temperature to a second set point temperature. If the second set point temperature is greater than the first set point temperature, then the test system may heat the IC chip(s), such as by use of a TCW 236. If the second set point temperature is less than the first set point temperature, then the test system may cool the IC chip(s), such as by use of a coldplate 232 or by reducing the power to the TCW 236. The wafer probe test system may wait until the measured temperature of the IC chip(s) and/or measured temperature of the heater zones is within a certain range of the set point temperature and/or is stable before testing the IC chip(s). It may be desirable to minimize the amount of time needed to change from the first set point temperature to the second set point temperature. The amount of time needed to change between the set point temperatures may be minimized when the rate of change in temperature is maximized.

The rate of temperature change can be adjusted based on one or more factors including, but not limited to, the properties of the TIM 234, the presence of a thermal decoupler between the TCW 236 and the coldplate 232, the configuration of the TCW 236, or a combination thereof.

In some instances, it may be desirable to balance the heating and cooling change times. For example, the amount of time needed to heat the DUT or a region of the DUT from a first set point temperature to a second set point temperature may be substantially the same as the amount of time needed to cool the DUT or the region of the DUT from the second set point temperature to the first set point temperature. In this manner, the rate of temperature change for heating is substantially the same as the rate of change for cooling. For example, the rate of temperature change for both heating and cooling can be 5° C. per second, 10° C. per second, or a higher rate of change. Balancing the heating and cooling rate may be accomplished by optimizing the TIM 234, controlling the heating power density, adjusting the fluid temperature or flow rate to a coldplate, or other means.

The WUT 201 or one or more IC chips on the WUT 201 can be heated at a fast rate when there is a high thermal resistance between the TCW 236 and the coldplate 232. In some embodiments, a higher thermal resistance may lead to a faster heating rate. A high thermal resistance between the TCW 236 and the coldplate 232 would mean high thermal isolation, or in some embodiments, a low thermal conductivity for the TIM 234.

The WUT 201 or one or more IC chips on the WUT 201 can be cooled at a fast rate when there is a low thermal resistance between the TCW 236 and the coldplate 232. In some embodiments, a lower thermal resistance may lead to a faster cooling rate. A low thermal resistance between the TCW 236 and the coldplate 232 would mean low thermal isolation, or in some embodiments, a high thermal conductivity for the TIM 234. In some embodiments, the properties of the TIM 234 can be such that the rates of temperature change when heating and cooling are substantially the same. For example, the TIM 234 of the disclosure may comprise a polymer film material having a thermal conductivity of about 0.1 W/mK and a thickness of 150 microns. Such a polymer TIM 234 may result in a rate of temperature change for both heating and cooling of about 2° C. per second.

In some embodiments, there is no TIM 234 material, and the effect of thermal resistance control is created by altering the interface surface of the TCW 236 (layer 600) and/or the coldplate 232 (e.g., altering the thermal contact resistance between adjacent surfaces).

Figure 9C:
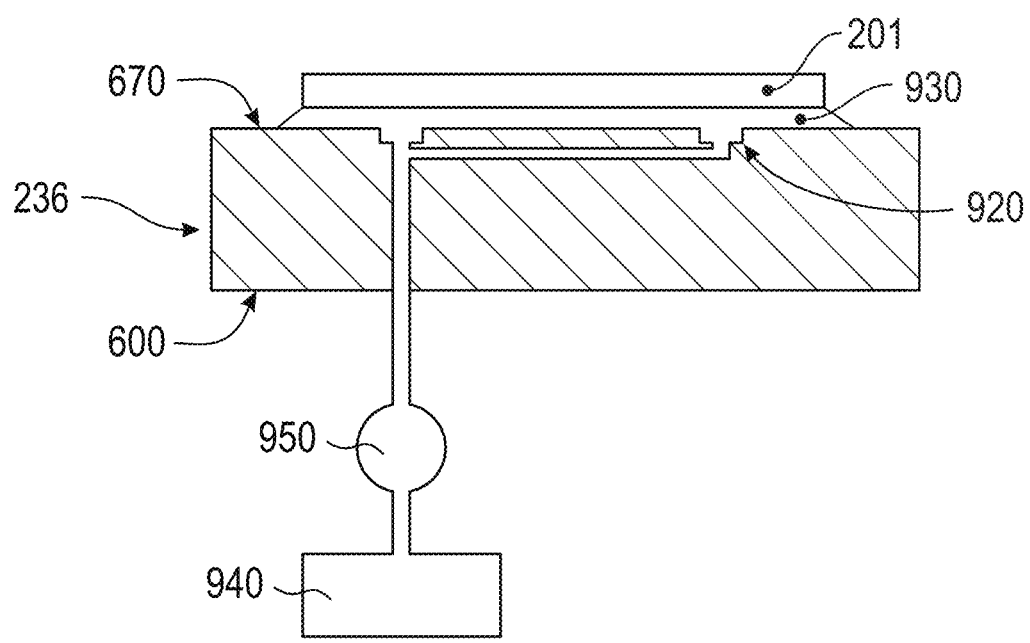
FIG. 9C illustrates an example TCW comprising holes or channels, according to some embodiments.

If a TIM material is located between the TCW 236 and the WUT 201, then a low thermal resistance from the WUT 201 to the TCW 236 may be achieved. In some embodiments, the TIM material may comprise water. In some aspects, using water as a TIM allows the TIM to be applied in extremely thin layers. Since the thermal resistance of a TIM is based on the TIM's thermal conductivity and its thickness, these thin layers may help achieve a low thermal resistance. A thin layer of water that is in a gap between two closely spaced surfaces also tends to remain in place due to capillary action and will not flow or ooze out of the gap. As shown in FIG. 9C, the TCW 236 could have holes or channels 920 to release water 930 to the outermost surface layer 670 that interfaces with the WUT 201 or to the bottommost surface layer 600 from a reservoir 940. These same holes or channels could be used to absorb excess water in the time period when one wafer has finished testing and is being removed from the TCW 236 and another wafer is being prepared to be mounted to the TCW 236. For example, a water-control element 950, such as a pump, could be used to either dispense water 930 to or remove water 930 from an outer surface of the TCW 236. In some embodiments, during testing of a wafer, water may be added to one or more surfaces (top surface or bottom surface) of the TCW 236. The added water may compensate for any water lost due to evaporation, which may occur, e.g., over long test times.

Figure 9D:
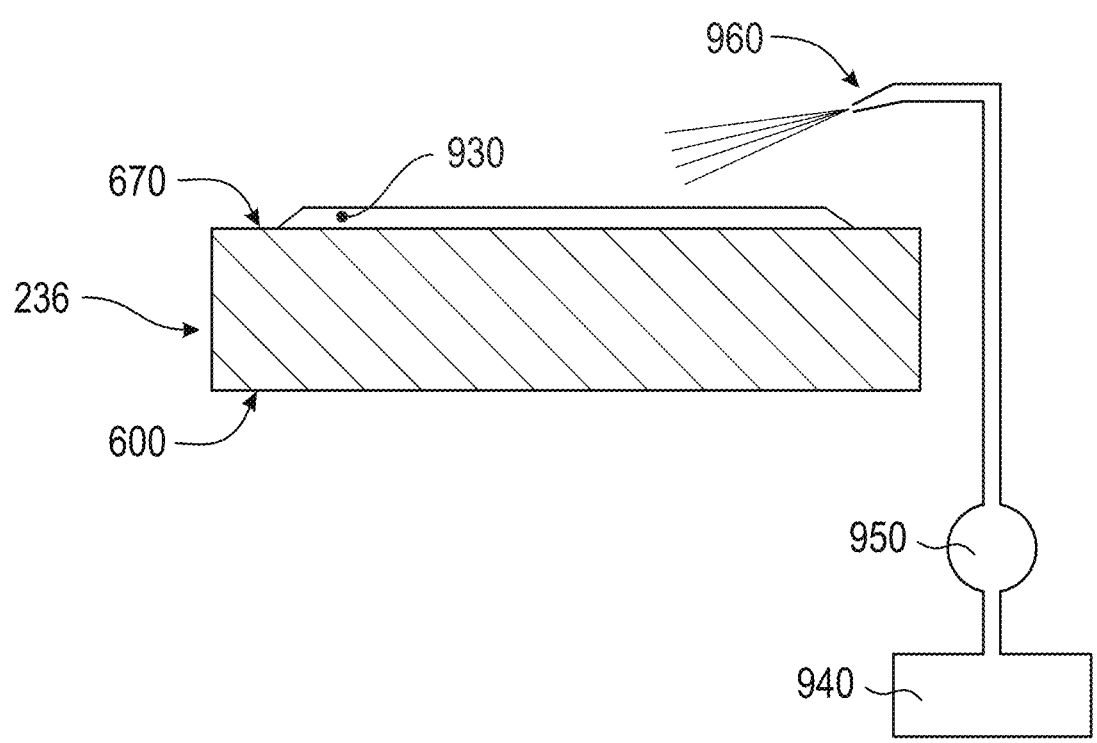
FIG. 9D illustrates an example applicator for a water-based TIM, according to some embodiments.

In some embodiments, as shown in FIG. 9D, the water-based TIM 930 may be applied to one or more surfaces of the TCW 236 via an applicator 960 external to the TCW 236 that sprays or otherwise deposits water on one or both of the outermost surfaces of the TCW 236 before a WUT is coupled to the TCW 236.

To use the heating-sensing elements as temperature sensors, the heating-sensing elements may be calibrated. In some embodiments, the calibration comprises determining the resistance of the heating-sensing elements at two or more different temperatures, and determining a linear, polynomial, or other relationship of the temperature versus resistance for each heating-sensing element. The calibration may be performed on the TCW prior to its inclusion in the chuck base (e.g., pre-determined), such as dunking the TCW in tanks of liquid held at different temperatures while measuring the heating-sensing element resistance. The calibration data (e.g., correlation between temperature and resistance) are stored and accessed by the thermal control system. The thermal control system may use the pre-determined calibration data for determining the temperatures during testing. In some respects, the thermal control system can adjust heater power (e.g., through pulse width modulation (PWM), coldplate fluid flow rate, or another factor to control the heater zone temperature to be close to a set point temperature.

The coldplate may be cooled by a coolant fluid, such as a liquid, refrigerant, or air. The fluid flow rate to the coldplate can be controlled for example by a flow valve or by variable flow pump, that regulates the amount of fluid flow to the coldplate or that can be switched between allowing flow to the coldplate and stopping flow to the coldplate. The flow valve can be used to control the amount of heat energy (cooling) that the coldplate can absorb. The coldplate may be coupled to a chiller that extracts heat energy from hot fluid exiting an outlet of a coldplate and supplies cold fluid to an inlet of a coldplate.

The test system 100 can comprise a thermal controller 180 that controls the coldplate 232, the TCW 236, or a combination thereof to change or maintain one or more temperatures of the top surface 236T of the TCW 236 or a top surface of the TCA 260 that is closest to and/or contacting the WUT 201. The thermal controller 180 can control the temperature(s) of the entire top surface 236T of the TCW 236 or select zones of the top surface 236T. For example, the test system can change or maintain the temperature of a heater zone and thereby of an IC chip or a group of IC chips to within a certain range (e.g., within 1° C., 5° C., etc. of a setpoint temperature).

In some embodiments, the heater zones of a TCW 236 may be selectively activated. In instances where some, but not all, heater zones are activated at a given time, the heater power may be used by the activated heater zones, allowing for a higher power density for the activated heater zones for a given overall input power. A higher power density for a heater zone may allow it to respond to localized temperature changes quicker.

In some cases, the heaters of the TCW 236 may be activated in rapid succession in a strobing fashion so that the entire surface of the TCW 236, and thus the WUT, reaches a uniform temperature with the least amount of temperature gradient across the surface. This type of strobing may be performed when the position of the WUT is aligned to the probe card or when the position of the TCA is determined using machine vision alignment during setup of the prober system. This procedure may be done at one or more of the target test temperatures, or some other temperature.

The coldplate may be cooled by a coolant fluid, such as a liquid, refrigerant, or air. The fluid flow rate to the coldplate can be controlled by a flow valve that regulates the amount of fluid flow to the coldplate, or the flow valve can be switched between allowing flow to the coldplate and stopping flow to the coldplate. The flow valve can be used to control the amount of heat energy (cooling) that the coldplate can absorb. The coldplate may be coupled to a chiller that extracts heat energy from hot fluid exiting an outlet of a coldplate and supplies cold fluid to an inlet of a coldplate.

TCA 260 comprises a coldplate, such as coldplate 232 shown in FIG. 2. The coldplate 232 may comprise a plurality of cooling channels that allow coolant to flow through. The coldplate 232 or its cooling zones may be configured to cool or maintain a temperature below the temperature of the corresponding TCW 236 and/or heater zones. The coldplate 232 may comprise one or more independently controllable cooling zones. In some embodiments, the number and/or configuration of the cooling zones may be substantially the same as the number and/or configuration of the heater zones. In some embodiments, the area, shape, and/or number of cooling zones may be different than the area, shape, and/or number of heater zones.

Figure 10:
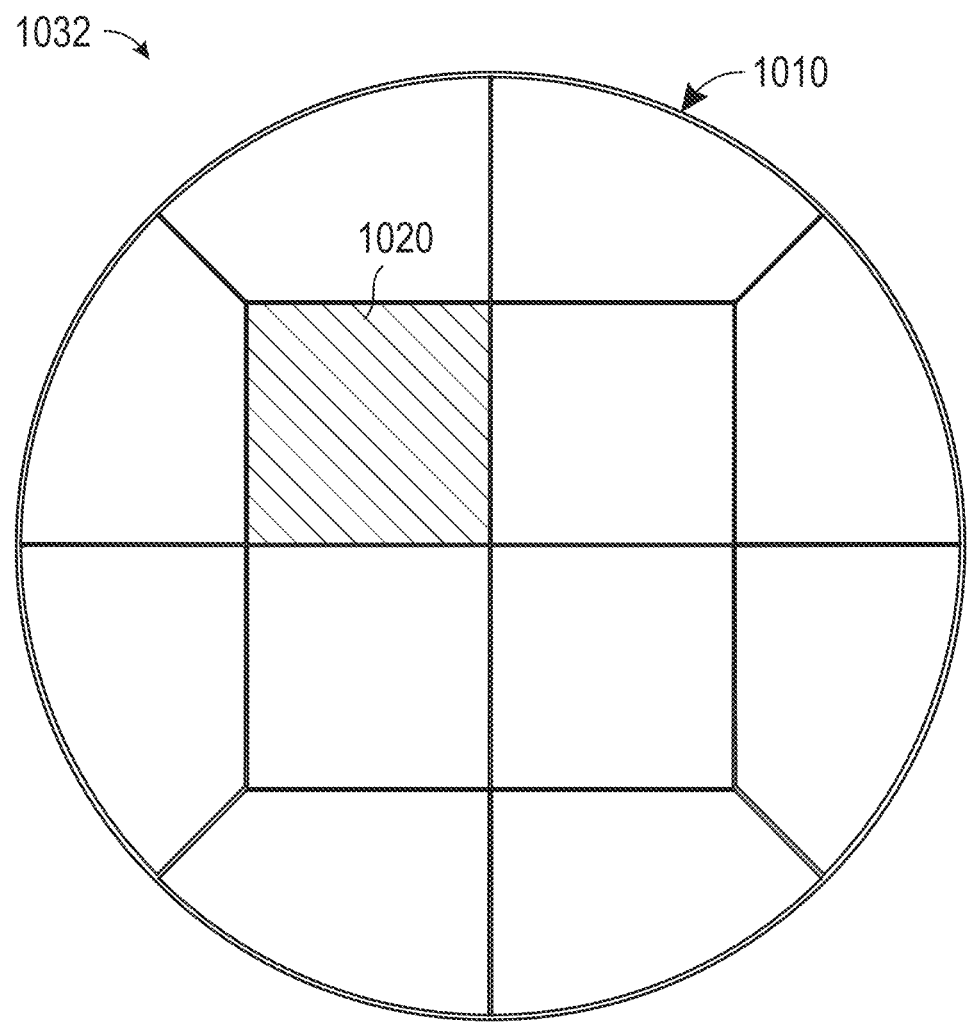
FIG. 10 illustrates an example coldplate comprising a plurality of independently controllable cooling zones, according to some embodiments.

FIG. 10 depicts an exemplary coldplate 1032. This coldplate 1032 is configured to have a plurality (e.g., 12) of independently controllable cooling zones. These cooling zones may have corresponding cooling elements, such as cooling element 1020 highlighted in FIG. 10. Coldplate 1032 comprises a lower coldplate member 1010 that sits below the cooling elements, such as cooling element 1020. In some embodiments, TCW 236 would have heater zones that are the same in number, location, and/or area as the cooling zones of coldplate 1032. The cooling zones may be configured with equal areas and with each having a similar cooling capability.

Figure 11A:
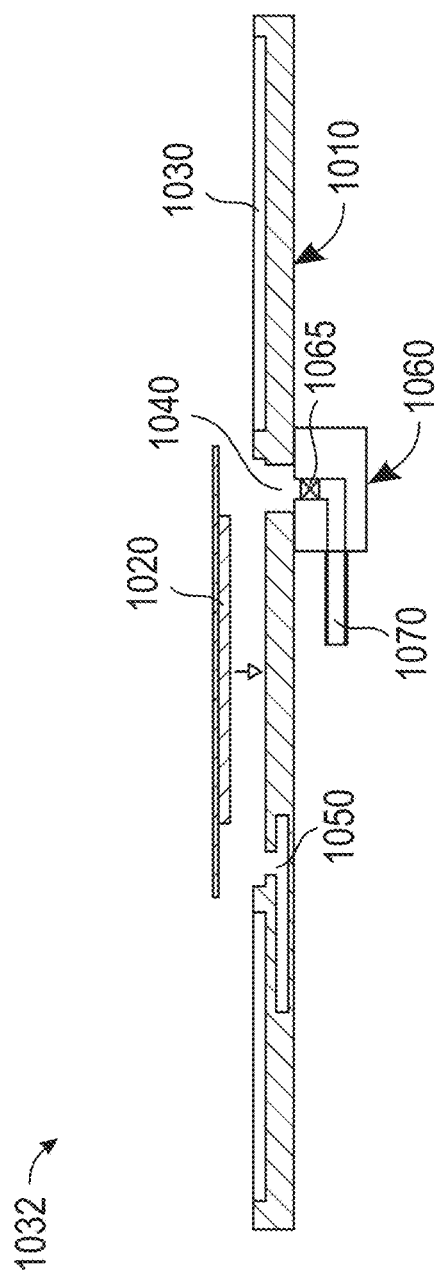
FIG. 11A and FIG. 11B illustrate cross-sectional views of example portions of coldplates, according to some embodiments.
Figure 11B:
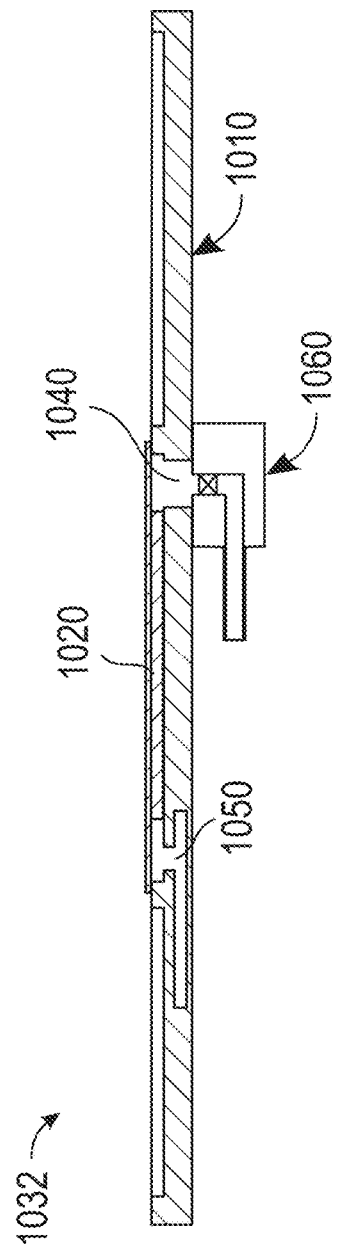

FIG. 11A and FIG. 11B illustrate cross-sectional views of example portions of coldplates 1032. A coldplate 1032 may comprise a lower coldplate member 1010 comprising a number of cavities, such as cavity 1030, in its upper surface. In some aspects, the number of cavities 1030 may be equal to the number of cooling zones. Lower coldplate member 1010 may be fabricated from a material with good thermal conductivity but also a material that is strong and stiff. In some instances, the coldplate assembly may be relatively large (e.g., 300 mm in diameter) and may be subject to internal forces due to the pressure of the coolant fluid. Although the lower coldplate member 1010 is shown as a single piece in FIG. 11A and FIG. 11B, it may comprise multiple pieces layered together to form liquid-tight flow channels and paths. In some examples, the coldplate 1032 may comprise a cooling element 1020 corresponding with each cavity, such as cavity 1030. FIG. 11A depicts cooling element 1020 separate from lower coldplate member 1010, while FIG. 11B depicts cooling element 1020 assembled with the lower coldplate member 1010. The cooling elements 1020 may comprise metal. In some embodiments, the cooling elements 1020 may be brazed, soldered, adhesively adhered, diffusion bonded, friction stir welded, or the like, into the cavities 1030. The assembly process may leave gaps between the cooling elements, such as cooling element 1020. These gaps must be filled, e.g., at least at the outer edge of the coldplate 1032. The vacuum ports may traverse across both the coldplate 1032 and the TCW 236. In some aspects, the coldplate 1032 and the TCW 236 may form a gas-tight seal to avoid or reduce vacuum leaks.

In some instances, different metal materials may be used for the lower coldplate member 1010 versus the cooling elements 1020. For example, the lower coldplate member 1010 may be fabricated from stainless steel, while the cooling elements 1020 are fabricated from copper. When two dissimilar metals are electrically coupled by an electrolyte, such as a coolant fluid, they may suffer corrosion at an accelerated rate. To mitigate this issue, the coolant fluid may have additives mixed with it, such as anti-corrosion additives, or both dissimilar metals can be plated with the same material (e.g., a nickel plating).

In most cases, after fabricating the coldplate 1032, the top surface of the coldplate 1032 (comprising multiple cooling elements 1020) may not be flat or planar. A planarization step, such as grinding, polishing, or lapping, may be performed on the top surface of the coldplate 1032. A final planarizing (e.g., kiss lapping) may be performed on any plating or coating applied to the top of the coldplate after the initial planarization step.

FIGS. 11A and 11B also show an inlet 1040 and an outlet 1050 formed in the lower coldplate member 1010 and coupled with a corresponding cavity 1030. FIG. 11B shows that when cooling element 1020 is assembled into its corresponding cavity in the lower coldplate member 1010. In some aspects, there may be formed a sealed fluid path with fluid entering at the inlet 1040, flowing through the fins of cooling element 1020 and the corresponding cavity 1030, and exiting the cooling zone through the outlet 1050. A valve assembly 1060 may provide the ability to independently control each cooling zone. FIG. 11A shows a valve assembly 1060 that comprises an inlet tube 1070 for bringing coolant fluid to the valve assembly 1060 and a valve 1065 within the valve assembly 1060. In some embodiments, valve 1065 is an on-off valve, or a variable (analog) flow control valve may be used. When used as an on-off valve, valve 1065 should have a quick actuation time (e.g., 50 milliseconds or less, 20 milliseconds or less, etc.). By having coolant fluid flow controlled to each cooling zone, the thermal control of a thermal zone that is comprised of a cooling zone and a corresponding heater zone may be enhanced. This allows control of the power to the heaters along with control of the coolant fluid flow to the cooling elements. Control of the power to the heaters and control of the coolant fluid flow help ensure a thermal zone is maintained at a set point temperature when desired, or can transition quickly from one set point temperature to another set point temperature.

The actuation of valve 1065 can be electrical or pneumatic. In some cases, pressure differences between the coolant fluid on one side of a sealing membrane and air pressure on the other side of the sealing membrane can act to either keep the value shut or allow the valve to open.

Furthermore, since the valve 1065 can turn on and off quickly, and due to the area of the cooling element 1020 and volume of related cavity 1030 being relatively small in comparison to a coldplate that is configured for covering a whole wafer, the thermal response of the cooling zone may be very quick. Also, with a fast-acting valve 1065, the coolant flow can be controlled in short bursts or pulses.

While FIG. 11A shows the valve 1065 controlling flow through the inlet 1040, the valve 1065 could also be arranged to control flow through the outlet 1050.

Figure 12:
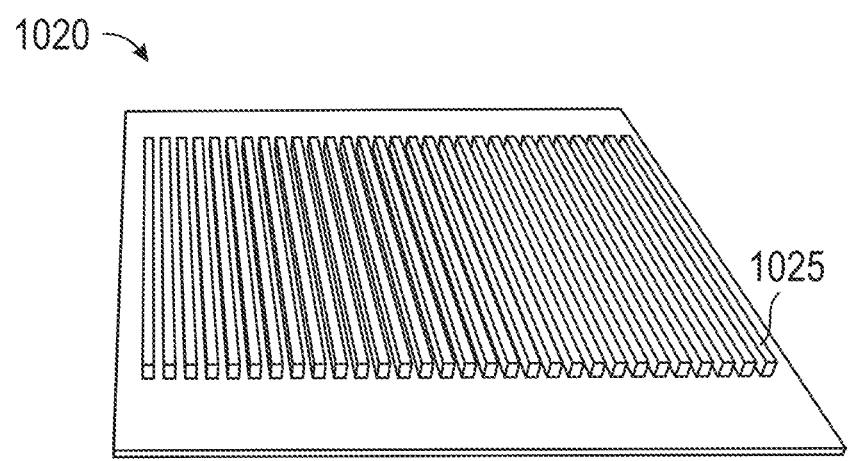
FIG. 12 illustrates a perspective view of the bottom of a cooling element, according to some embodiments.

FIG. 12 shows a perspective view of the bottom of a cooling element, such as cooling element 1020. The cooling element may comprise fins 1025 for providing a large surface area that can be in contact with the flowing coolant, which may provide good heat transfer from the fins (and thereby from the cooling element) to the coolant. Although multiple rows of straight fins are depicted in FIG. 12, any configuration of fins (such as a plurality of pin fins, curved fins, fins of varying shape, or other fin configurations) may be used. In some embodiments, when cooling element 1020 is assembled into its associated cavity in the lower coldplate member 1010, a portion of a fin or another structure, such as a post, on the cooling element 1020 may attach to the lower coldplate member. Attaching a portion of cooling element 1020 to the bottom of the cavity provides a structural benefit of restricting the deflection of the cooling element 1020 when it is subject to the pressure of the coolant fluid. In some aspects, the top surface of the coldplate 1032 may remain flat helping with good thermal coupling from the coldplate 1032 to the WUT.

Figure 13:
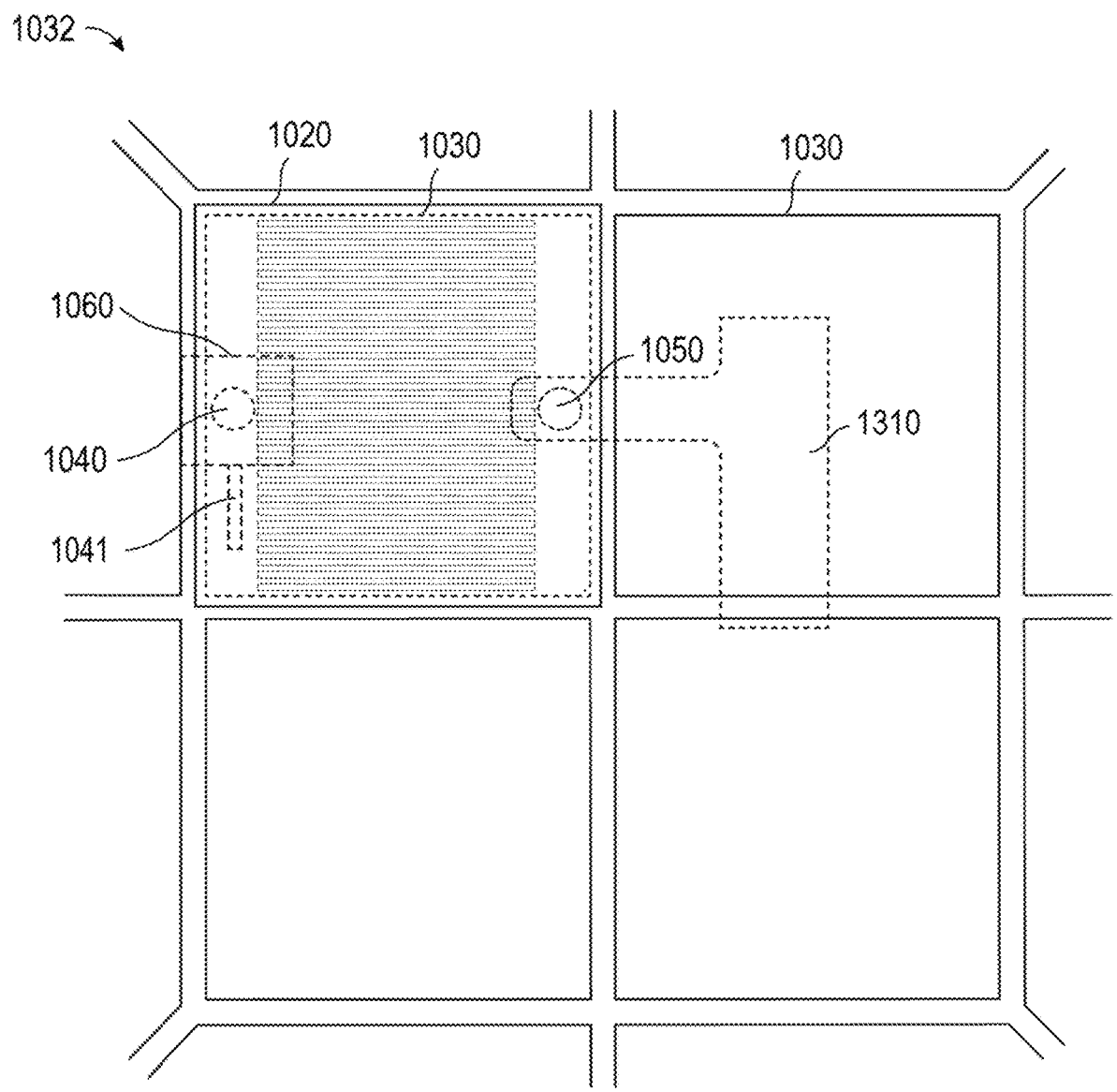
FIG. 13 illustrates a top-down view of a portion of coldplate, according to some embodiments.

FIG. 13 depicts a top-down view of a portion of coldplate 1032. The cooling element 1020 is aligned with a cavity 1030 in the lower coldplate member 1010. It can be noted that the fins of the cooling element 1020 do not extend completely across the cavity 1030, since there must be a location for fluid inlet and fluid outlet. Inlet 1040 and outlet 1050 are configured to provide a fluid inlet and fluid outlet, respectively, from the underside of the lower coldplate member 1010. As discussed above, valve assembly 1060 turns coolant fluid flow through the inlet 1040 on or off. Channels within coldplate 1032, such as channel 1310, can collect the fluid flow from the outlets of one or more cooling zones. Channels with coldplate 1032, such as channel 1320, can supply fluid flow to the inlets of one or more cooling zones. As such, channels within the coldplate 1032, such as channel 1310 and channel 1320 are configured to allow a coolant fluid to flow through the coldplate 1032 to, in some cases, cool or maintain a temperature of the coldplate 1032 below the temperature of the TCW 236. Although FIG. 13 depicts an inlet 1040 located at the side of the fins 1025, in some embodiments, one or more inlets 1040 may be located in vertical alignment with the fins 1025, allowing vertical impingement of the coolant fluid on the fins 1025.

In some embodiments, the TCW 236 and the coldplate 232 in a TCA 260 may be separate components. By configuring the TCW 236 and the coldplate 232 as separate components, they may be switched out easily for purposes of, e.g., tailoring the TCA 260 for certain WUTs to be tested. To have the TCW 236 easily detachable from the coldplate 232, in some aspects, the electrical connections may be reliable and can carry high current in use, but also may be easily separated when desired. For example, a pin may be inserted into a mating connector for the electrical connection.

Figure 14:
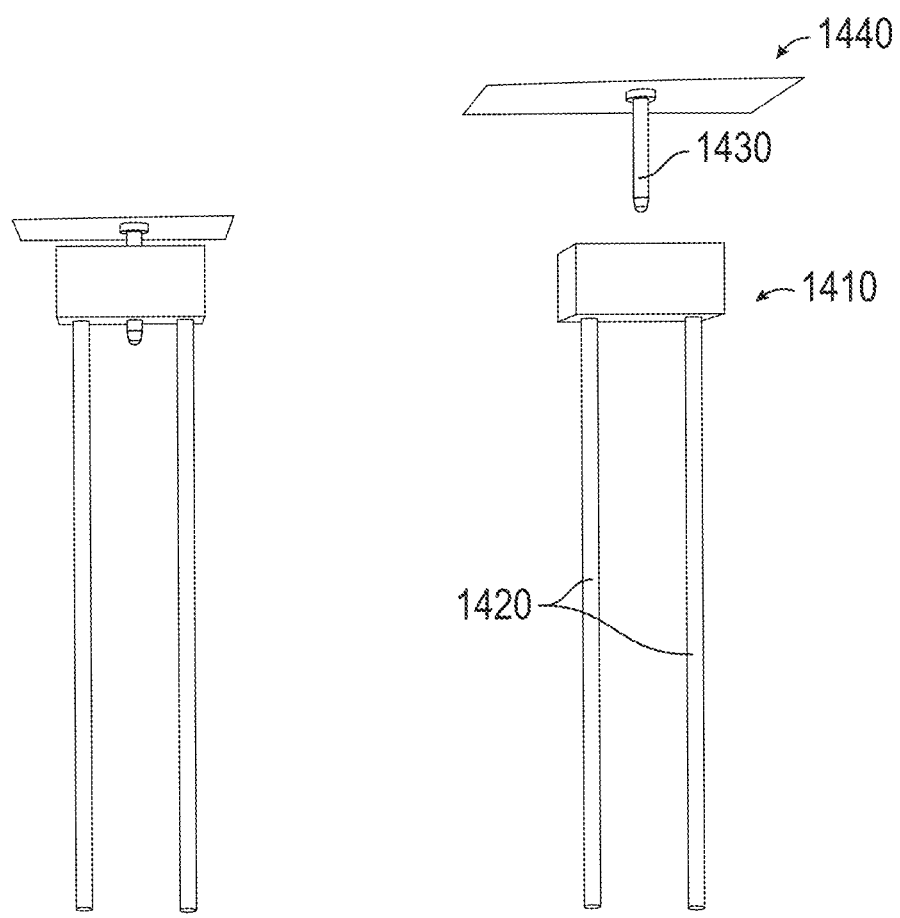
FIG. 14 illustrates an example pin and connector configuration for a TCA, according to some embodiments.

FIG. 14 shows an example of a pin and connector configuration suitable for TCA 260, with the view on the left showing a pin 1430 (on a portion of a TCW 1440) inserted into a connector 1410 and the view on the right showing the pin 1430 on the TCW 1440 disengaged from the connector 1410. It may be noted that the connector of FIG. 14 accepts one pin 1430 to be inserted into it, but it provides two connector pins 1420 emanating from it. In some embodiments, the connector may be configured for one pin 1420 to be inserted into and one pin 1420 to emanate from the connector.

Figure 15:
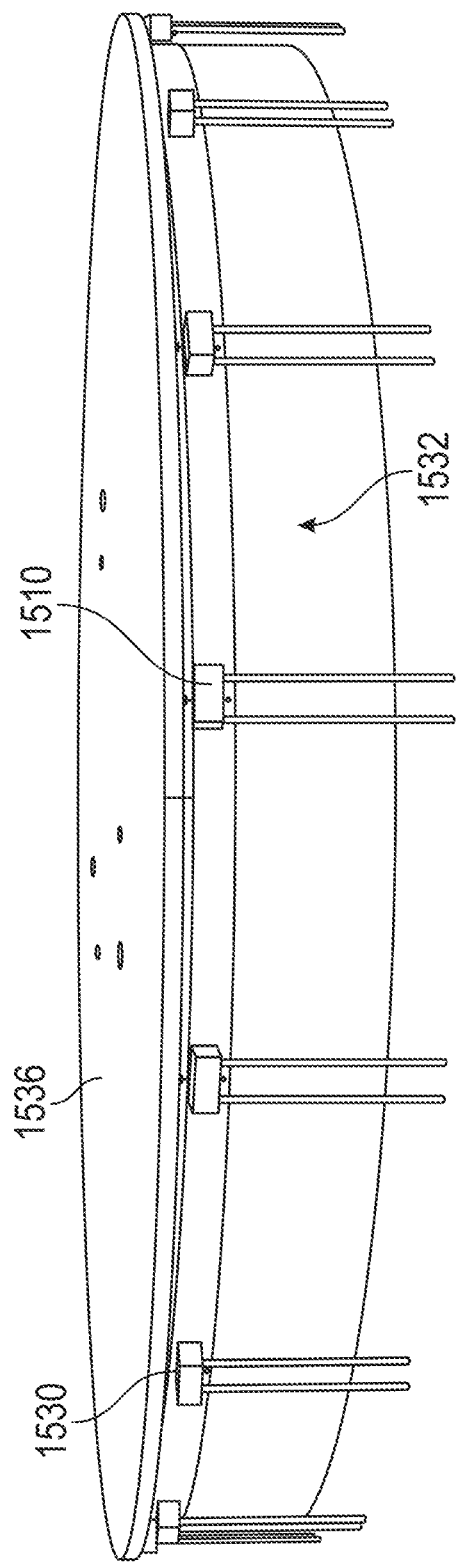
FIG. 15 illustrates an example TCW with attached pins, according to some embodiments.

FIG. 15 depicts TCW 1536 with pins 1530 attached to it. Below TCW 1536 are connectors 1510. The pins 1530 on TCW 1536 can be inserted into corresponding connectors 1510 to make a reliable electrical connection. The pins on the TCW 1536 and the connectors 1510 are chosen such that when they are mated their overall length is long enough to stretch from the top of the coldplate 1532 to the bottom of the coldplate 1532. In some aspects, there would be a PCA under the bottom of the coldplate 1532 or incorporated into the coldplate 1532 and the pins from the connectors would be soldered to this PCA. Also FIG. 15 shows the connectors 1510 having exposed pins, but it would be more typical for there to be a structure that houses the connectors to protect the connectors and their pins and keep them aligned so they can be soldered to the PCA.

It should be noted that as the number of heater zones increases, the number pins needed on the TCW 236 increases. As discussed above, for a two-wire connection there is a connection at each end of the heater-sensing element. For a four-wire connection to a heater zone within the TCW 236, there may be two wire connections at each end of the heater-sensing element. In some aspects, the number of heater zones on the TCW increases the number of traces and the number of pins. In some instances, a four-wire connection internal to the TCW 1536 for each heater zone may not be suitable. FIG. 14 and FIG. 15 depict the case where the four-wire connection is made at the connector versus internal to the TCW 1536. In other words, a single wire or trace comes from one end of a heater-sensing element and connects to a pin 1530 on the TCW 1536, while the connector 1510 splits that single electrical path (the trace and corresponding pin 1530 of the TCW 1536) into two paths (the two connector pins 1420 emanating from the bottom of the connector 1410).

The TCA 160 can comprise a thermal controller 180 that controls the coldplate 232, the TCW 236, or a combination thereof to change or maintain one or more temperatures of the top surface 236T of the TCW 236 that is closest to and/or contacting the WUT 201 (semiconductor wafer or panel). In some aspects, the semiconductor wafer or panel comprises singulated dies. The thermal controller 180 can control the temperature(s) of the entire top surface 236T of the TCW 236, the entire surface of the coldplate 232, or select zones of the top surface 236T or coldplate 232. For example, the thermal controller 180 can change or maintain the temperature of a thermal zone by adjusting power to the heaters in the heater zone, adjusting coolant flow to the cooling elements in a cooling zone, or by adjusting both. The thermal controller 180 may maintain the temperature of an IC chip or a group of IC chips on the WUT 201 to within a certain range (e.g., within 1° C. of a set point temperature or within 0.1° C. of a set point temperature).

In some embodiments, the heater zones of a TCW 236 may be selectively activated. In instances where some, but not all, heater zones are activated at a given time, the heater power may be used by the activated heater zones, allowing for a higher power density for the activated heater zones for a given overall input power. A higher power density for a heater zone may allow it to respond to localized temperature changes more quickly.

In instances where some, but not all, cooling zones of a coldplate 232 are activated at a given time, the cooling capability available from the chiller 170 may be used by just the activated cooling zones, allowing for a higher cooling capacity for the activated cooling zones for a given overall input chiller cooling capacity.

In some embodiments, the heater zones, cooling zones, or both can be activated in a stepwise manner. For example, one or more first heater zones, cooling zones, or both can be activated at a first time, one or more second heater zones, cooling zones, or both can be activated at a second time, one or more third heater zones, cooling zones, or both can be activated at a third time, etc. The heater zones, cooling zones, or both can be activated according to the location of the IC chips on the WUT 201 being tested at a given time.

Figure 16A:
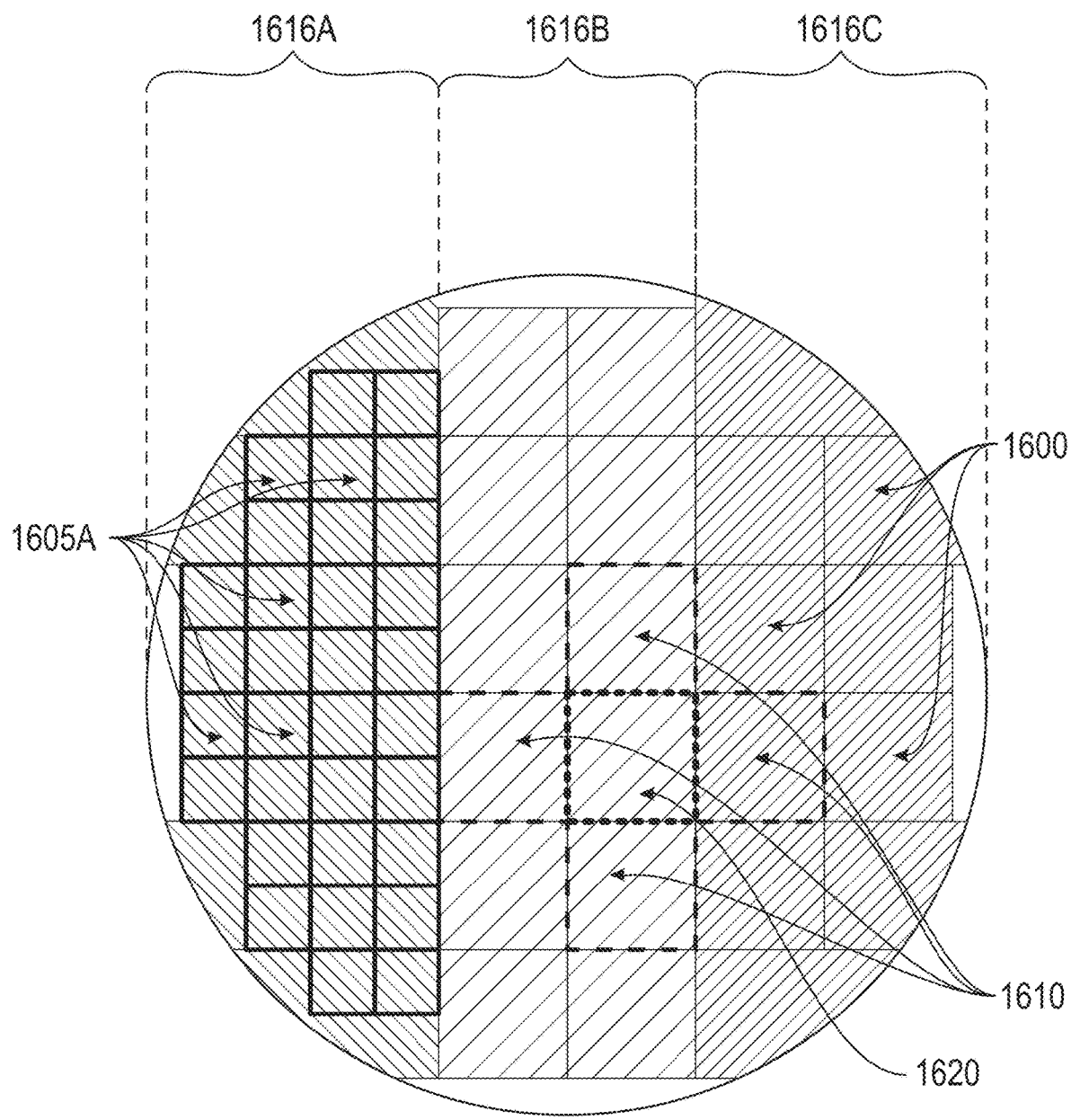
FIG. 16A illustrates a top, schematic view of an example plurality of heater zones configured as columns, according to some embodiments.
Figure 16B:
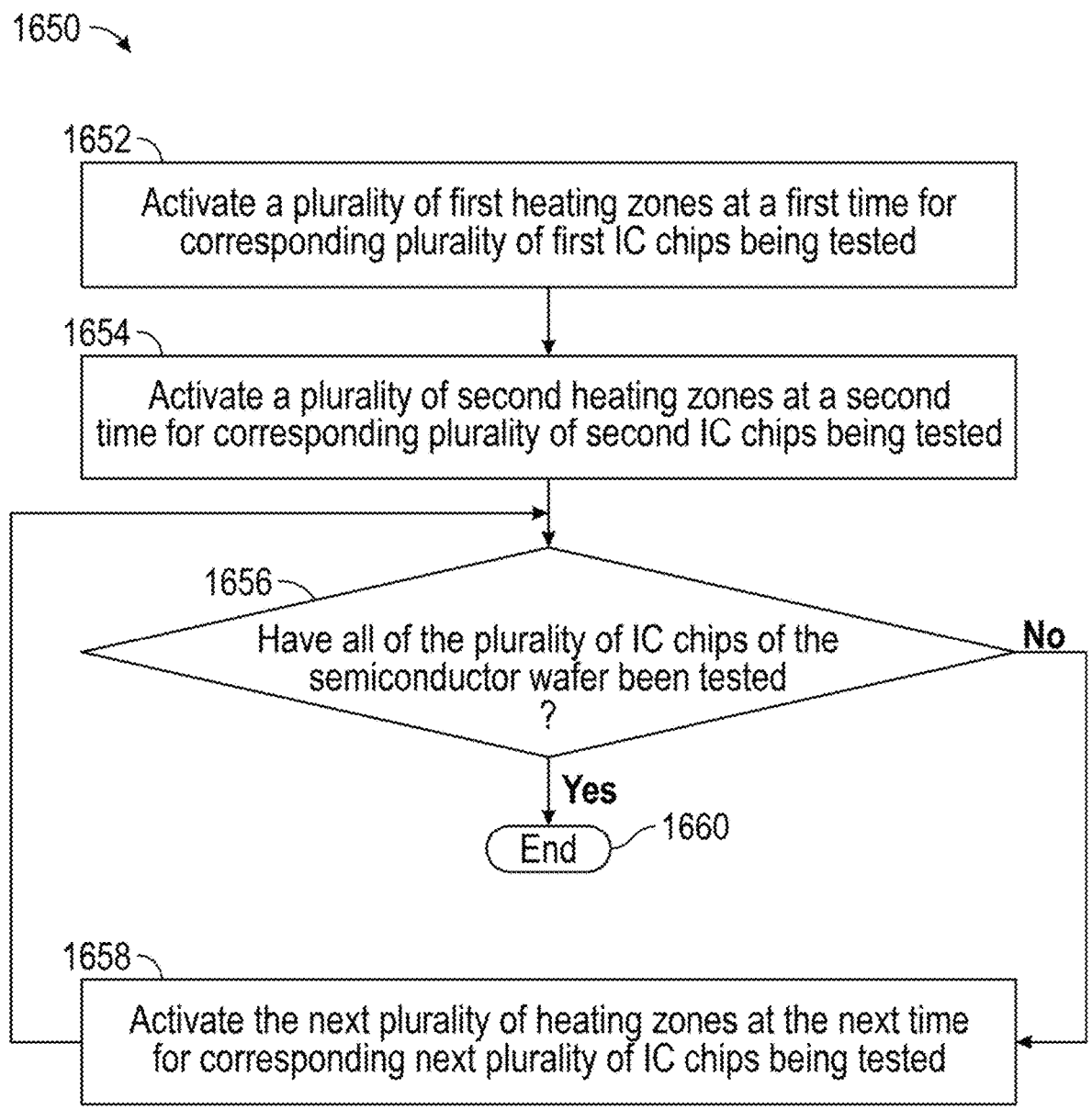
FIG. 16B illustrates an example flowchart for activating a plurality of heater zones, according to some embodiments.

FIG. 16A illustrates a top, schematic view of an example plurality of heater zones 1600 configured as columns, and FIG. 16B illustrates a flowchart for activating the plurality of heater zones, according to some embodiments. In step 1652 of process 1650, one or more first columns of heater zones 1616A may be activated at a first time when corresponding one or more first IC chips 1605A are being tested. In step 1654 of process 1650, the next plurality of heater zones 1600 may be activated at the next time when the next plurality of IC chips is being tested. For example, the next plurality of heater zones may be one or more second columns of heater zones 1616B activated at a second time when corresponding one or more second IC chips are being tested. The process may be repeated until some (e.g., all) of the IC chips 1605A on the WUT 201 are tested. For example, at step 1656, the test system can check whether the plurality of IC chips of the WUT 201 to be tested have been tested. If not, the next plurality of heater zones at the next time for the corresponding next plurality of IC chips being tested can be activated at step 1658; e.g., a plurality of third heater zones 1616C arranged in a third column of heater zones are activated at a third time when corresponding plurality of third IC chips are being tested. If the plurality of IC chips of the semiconductor wafer to be tested have been tested, then the process 1650 can end (step 1660). Control of the cooling zones can be provided in a similar manner as just described for heater zones.

In some embodiments, one or more first column of heater zones 1616A may be located on the left side of the TCW 236, one or more second column of heater zones 1616B may be located in the middle, and a plurality of third heater zones that comprise the third column of heater zones 1616C may be located on the right side, as shown in FIG. 16A. In this manner, different heater zones may be activated at different times until a plurality (e.g., all) of the IC chips of the WUT 201 are tested. In a similar fashion, cooling zones can be controlled as described for the heater zones. Embodiments of the disclosure may comprise other sequences for activating the heater zones or cooling zones, such as starting with the rightmost column heater zones or cooling zones and moving to the left of the TCW 236, starting with the topmost row heater zones or cooling zones and moving to the bottom of the TCW 236, starting with the bottommost row heater zones or cooling zones and moving to the top of the TCW 236, etc. The sequence may be a pre-determined sequence stored in flash memory, for example. In some embodiments, the sequence for activating the heater zones may be based on an addressing scheme. As one non-limiting example, the sequence for activating the heater zones may start with the heater zone in the first row and first column, then move right across the columns and down through the rows. While the above discussion relates to activating the heating or cooling zones depending on the location of one or more chips being tested at a given time (the DUTs), the activation of the heating or cooling zones could be dependent on the location and area of the probe card towards the WUT. The choice of which cooling or heater zones to activate may be such that the area of the activated zones is larger than the area of the DUTs being tested or the area of the probe card in the current test location. In some aspects, the cooling and heater zones may be activated based on location information retrieved from a chuck base and probe head area from, e.g., a prober and by methods of, e.g., ray casting against zone map to determine which zones should be controlled.

The heater zones may be activated by stepping from a current location to a location far away from the current location. The stepping away from the current location may help move the heater zones away from, e.g., localized heating from the current test.

In some embodiments, the heater zones and cooling zones may be the same size, shape, number, and/or location. For example, heater zones 1600 in FIG. 16A could have similar cooling zones located under them. Even though the cooling and heater zones may be of the same size, shape, number, and/or location the control of the cooling zones and heater zones can be such that the activated zones are not equivalent in area. For example, heater zone 1620 may be activated during testing of chips on a WUT 201 during a heating time period. In some aspects, during a cooling period for the same chips on the WUT 201, the cooling zones (that are similar in size, shape, number, and location to the heater zones) under heater zone 1610 and heater zones 1620 may be activated. In another aspect, one or more heater zones, such as heater zone 1620, may be activated during testing of DUTs, and at the same time one or more cooling zones, such as heater zones 1610, may be activated so that the heating and cooling of the DUTs can be controlled simultaneously to achieve a target temperature, wherein in this example case the area of the activated heater zone is different from the area of the activated cooling zone.

In some cases, the heater zones may be activated based on the locations of a chip or group of chips being tested or the location of the probe card, where the thermal controller 180 has some knowledge of these locations (where a chip or group of chips being tested is located on the WUT 201 or where the probe card is located on the WUT). In some cases, the thermal control system may have no knowledge of the location of a chip, or a group of chips being tested or of the location of the probe card. In this situation, the thermal controller 180 may attempt to maintain one or more (e.g., all) portions of the surface of the TCW 236 at a desired set point temperature. Maintaining the portion(s) at a desired set point may include stepping through the heater zones in some sequence and/or adjusting the heating (or cooling) of the heater zones individually. For example, the thermal controller 180 may step through all the heater zones, and the thermal control system can rapidly determine heater zone temperature and adjust the power of the heater-sensing element based on the determination. Using the TCW 236 of FIG. 7 as an example, the thermal controller 180 may step from one heater zone (octant) to an adjacent octant and proceed in this fashion around the entire surface of the TCW 236. In some aspects, the thermal controller 180 may determine a different stepping pattern, such as stepping from one heater zone to a heater zone positioned on the opposite side of the TCW 236.

Figure 17:
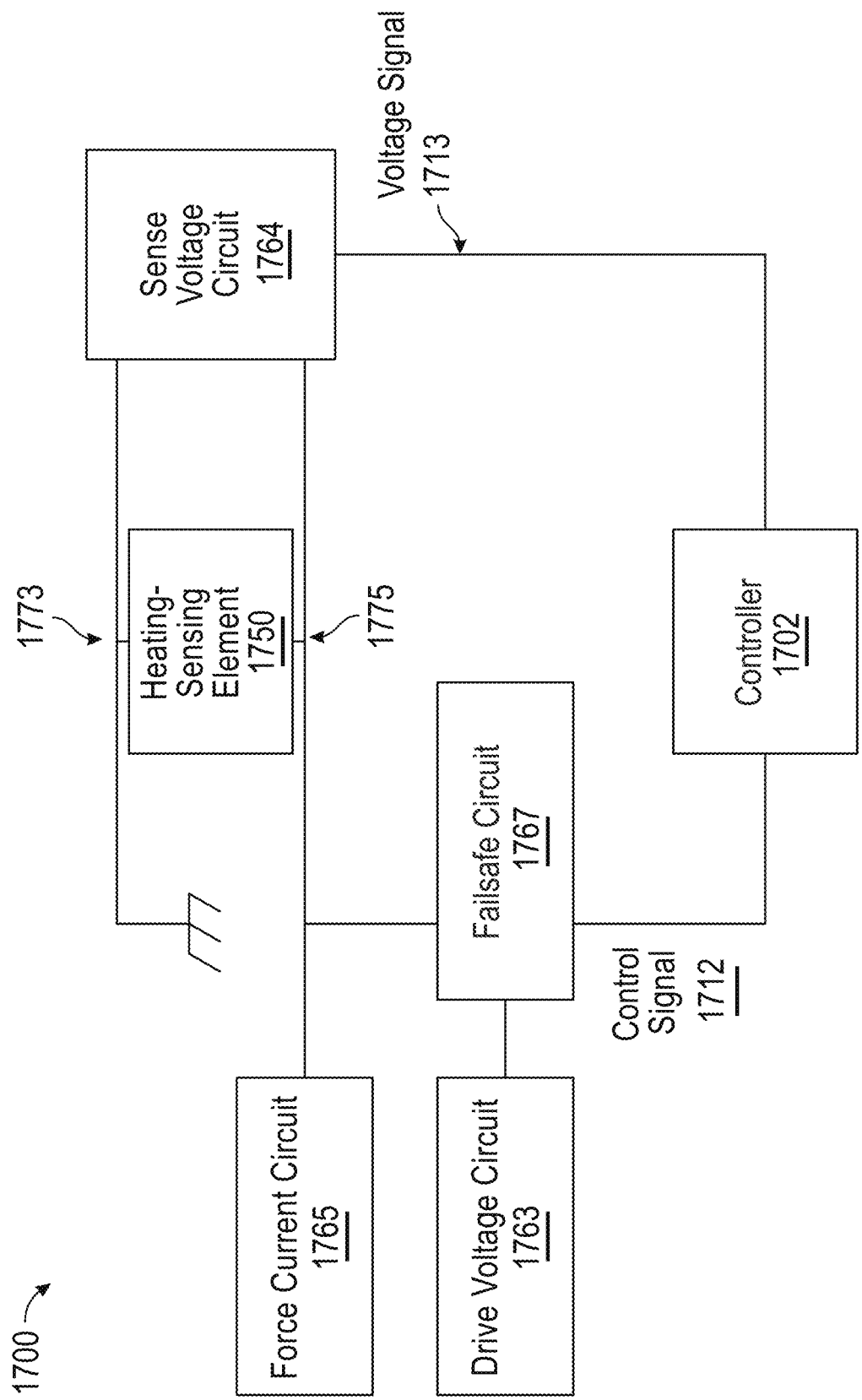
FIG. 17 illustrates a block diagram of an example circuit for a heating-sensing element, according to some embodiments.

FIG. 17 illustrates a block diagram of an example circuit for a heating-sensing element, according to embodiments of the disclosure. Heating-sensing circuit 1700 comprises a circuit for operating a heating-sensing element 1750 in a plurality of operation modes: heating mode, sensing mode, and off mode. Heating-sensing circuit 1700 comprises a drive voltage circuit 1763, a controller 1702, a force current circuit 1765, a sense voltage circuit 1764, and a failsafe circuit 1767. The drive voltage circuit 1763 may be coupled to the controller 1702, the failsafe circuit 1767, and a node 1775 of the heating-sensing element 1750. The drive voltage circuit 1763 receives one or more control signals 1712 from the controller 1702 and is configured to turn on the heating-sensing element 1750, causing it to generate heat during a heating mode. The drive voltage circuit 1763 may operate in accordance with the one or more control signals 1712, such as turning off the heating-sensing element 1750 to prevent it from generating heat (e.g., during sensing or off mode).

The force current circuit 1765 may be coupled to the controller 1702 and the node 1775 of the heating-sensing element 1750. The force current circuit 1765 provides a current signal to the heating-sensing element 1750 during the sensing mode in response to one or more control signals 1712 from the controller 1702. The current signal from the force current circuit 1765 causes a current to flow through the heating-sensing element 1750. The sense voltage circuit 1764, coupled to both nodes 1773 and 1775 of the heating-sensing element 1750, determines the voltage drop across the nodes 1773 and 1775 and generates the voltage signal 1713 indicative of this voltage drop. The voltage signal 1713 is processed (e.g., converted by an analog-to-digital converter, amplified, etc.) and sent to controller 1702. One skilled in the art would understand the controller may be implemented in hardware or software.

In some embodiments, the heating-sensing circuit 1700 comprises a failsafe circuit 1767. The failsafe circuit 1767 is configured to reduce the likelihood of or prevents one or more heating-sensing elements 1750 from overheating and/or failing. In some instances, the heating-sensing element 1750 may be inadvertently shorted to ground. With a short to ground, controller 1702 determines the resistance of the heating-sensing element 1750 as being lower than its actual resistance. The controller 1702 may also determine the temperature of the heating-sensing element 1750 is lower than its actual temperature, which may cause the controller 1702 to try to increase the power to the heating-sensing element 1750 (if without the failsafe circuit 1767). Excess power may cause the heating-sensing element 1750 to generate too much heat and fail. The failsafe circuit 1767 prevents excess power from being sent to the heating-sensing element 1750, e.g., during the heating mode. In some embodiments, the failsafe circuit 1767 and/or controller 1702 may determine that one or more criteria have not been met and prevents the drive voltage circuit 1763 from providing a voltage to the heating-sensing element 1750. Example criteria including, but are not limited to, the temperature of the DUT being greater than a temperature threshold, the power of the DUT being greater than a power threshold, the heating-sensing element 1750 being shorted, or the heating-sensing element 1750 being an open circuit. For example, controller 1702 may determine that the criteria have not been met and generates an error in response that is then communicated to the failsafe circuit 1767. In some embodiments, the failsafe circuit 1767 includes a fuse that fails and/or creates an open circuit when the heating-sensing element 1750 is shorted.

Controller 1702 determines the temperature of the heating-sensing element 1750 based on the voltage signal 1713 and the current signal from the force current circuit 1765. In some embodiments, controller 1702 comprises an FPGA. Using an FPGA for thermal control may be beneficial due to its accuracy of the time base, or the level of precision due to the frequency used for timing. Any variation in the time base may distort the "D" or derivative term in a PID algorithm and cause errors in thermal control. Furthermore, an FPGA can support very fast floating-point calculations, which may be needed for the control algorithms. Additionally, an FPGA can support high frequencies (e.g., 5 kHz frequency, or in other words, a temperature measurement every 200 microseconds (every 200 μs)) for driving one or more control signals to a heating-sensing element 1750. A high rate of temperature measurements allows more precise control of the temperature of the heating-sensing elements 1750.

In some embodiments, the heating-sensing circuit 1700 operates as a feedback loop. The heating-sensing circuit 1700 causes the heating-sensing element 1750 to generate heat during a heating mode. The heating-sensing circuit 1700 also determines the resistance or temperature of the heating-sensing element 1750 during a sensing mode. The properties of the heating-sensing circuit 300 during the heating mode is determined and/or dynamically adjusted based on the resistance or temperature determined during the sensing mode. The heating-sensing circuit 1700 alternates between the modes. In some embodiments, a time period includes one portion where the heating-sensing circuit 1700 operates in the heating mode, one portion where the heating-sensing circuit 1700 operates in the sensing mode, and optionally, one portion where the heating-sensing circuit 1700 operates in an off mode. In the off mode, the heating-sensing element 1750 is neither generating heat nor sensing the temperature. In some embodiments, each heating-sensing element 1750 is associated with a unique heating-sensing circuit 1700.

Figure 18:
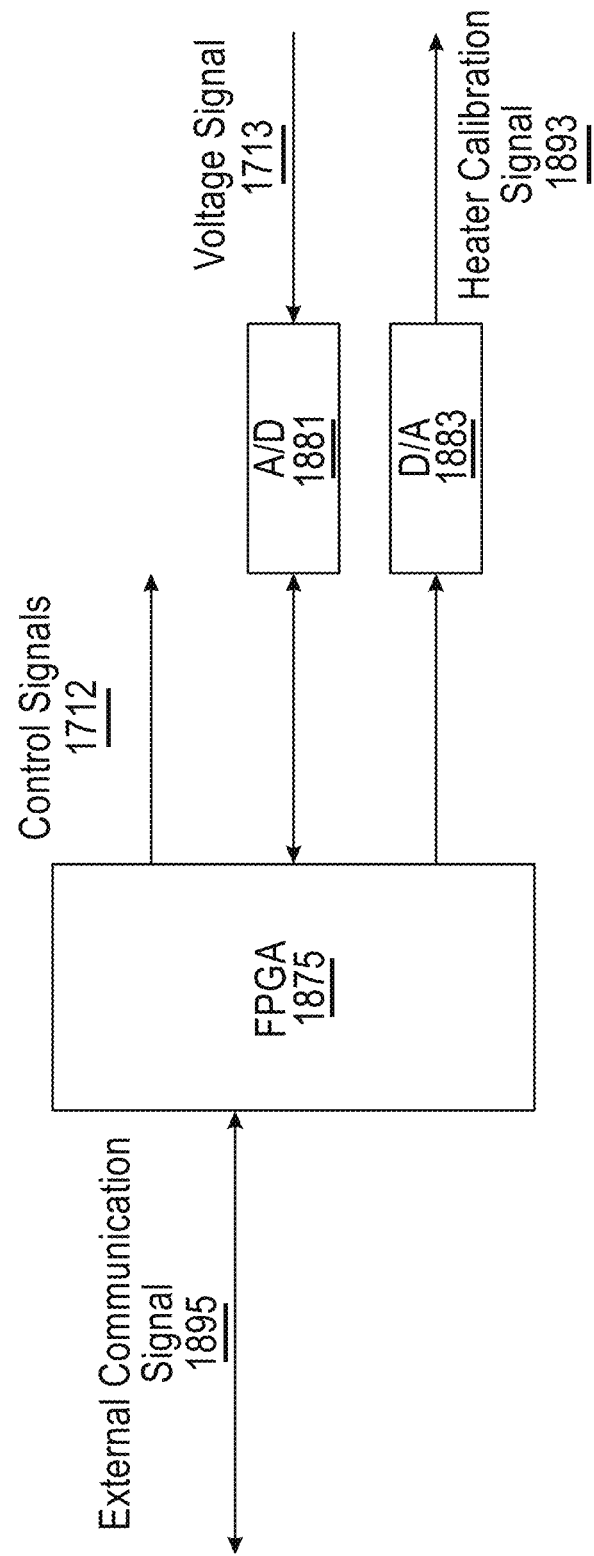
FIG. 18 illustrates a block diagram of an example controller, according to some embodiments.

FIG. 18 illustrates a block diagram of an example controller 1702, according to embodiments of the disclosure. Controller 1702 comprises one or more components, such as (but not limited to) an FPGA 1875 (or the like), A/D converter 1881, and D/A converter 1883. The FPGA 1875 may output one or more signals to D/A converter 1883, which then converts the signal to a heater calibration signal 1893 used to calibrate the heating-sensing element 1750 (as discussed above). The heater calibration signal 1893 may comprise calibration information, and in some embodiments, the calibration information may be used by the controller 1702 to determine the measured temperature of the heating-sensing element 1750.

The A/D converter 1881 converts the voltage signal 1713, and then outputs the converted signal to FGPA 1875. The voltage signal 1713 may be indicative of a voltage drop across nodes of the heating-sensing element 1750. The voltage signal 1713 may be used to determine the measured temperature of the heating-sensing element 1750.

Additionally, FPGA 1875 outputs one or more control signals 1712 to control the drive voltage circuit 1763 for generating and providing power to the heating-sensing element 1750 (as discussed above). In some embodiments, the FPGA 1875 may send and/or receive external communication signals 1895 to a controller (e.g., a thermal controller 2102 of FIG. 21).

In some embodiments, inputs other than the temperature of a heater zone may be used by the thermal controller 180. For example, the temperature of a chip or group of chips on the WUT 201 may be measured within the chip or group of chips itself—such as through forward-biasing a diode dedicated to temperature measurement located within a chip or multiple chips. Similarly, the power of a chip or group of chips being tested on the WUT can be used as a thermal control input.

In cases where DUT power is used as an input to the control system (and in some instances, where more than one DUT (chip) is being tested at one time (e.g., the probe head may contact two or more chips at the same time allowing for a plurality of chips to be tested at the same time or DUT may have multiple power output channels), then the control system may take power input from more than one DUT and perform a mathematical operation on those inputs to provide a single resultant power input to the thermal controller 180. For example, the multiple power inputs could be summed together, averaged, or the highest power density could be determined (or other resultant determined by a mathematical operation). In cases where a plurality of DUTs is tested at once, temperature inputs from multiple DUTs could be provided to the thermal control system, and the thermal control system can perform a mathematical operation to derive a resultant value used for its thermal control algorithm. For example, based on multiple DUT input temperatures, the highest DUT temperature or the average DUT temperature, or the mean DUT temperature could be determined as a resultant of a mathematical operation and that resultant used by the thermal controller 180. These resultant inputs, whether derived from DUT temperatures or DUT powers or both, can be used as inputs to the thermal controller 180 to control the heater zones, the cooling zones, or both.

In some cases, the WUT power (power feedback, (PF)) is monitored in real time as an input to the control system. The PF may be multiplied by a pre-determined constant factor (K-Theta) to determine a heater zone offset temperature. K-Theta is determined by a calibration process. The heater zone offset temperature is used to adjust the target temperature of the heater zone. In other words, both the WUT PF and the temperature of a heater zone or a group of heater zones is used for temperature control purposes. For example, a heater zone or a group of active heater zones is maintained at a temperature of 32° C., then 50 W is applied to the WUT (PF of 50 W). A signal indicating this power level and where it is applied on the WUT is transmitted to the thermal controller 180. The thermal controller 180 takes the PF and multiplies it by K-Theta. If K-Theta is 0.1° C./W in this example, the thermal offset would be calculated as 5° C. (50 W×0.1° C./W). This thermal offset would be used to adjust the heater zone target temperature lower since there may be self-heating from the power applied to the WUT (a new heater zone target temperature of 32° C.−5° C.=27° C. in this example). The control system would use a feedback loop to control the active heater zones to this new target temperature (using both the WUT power and the heater zone temperatures for temperature control). The control system would control the heater zone temperature to 27° C. in this example, which would translate to a DUT temperature of 32° C., the desired test temperature.

Figure 19:
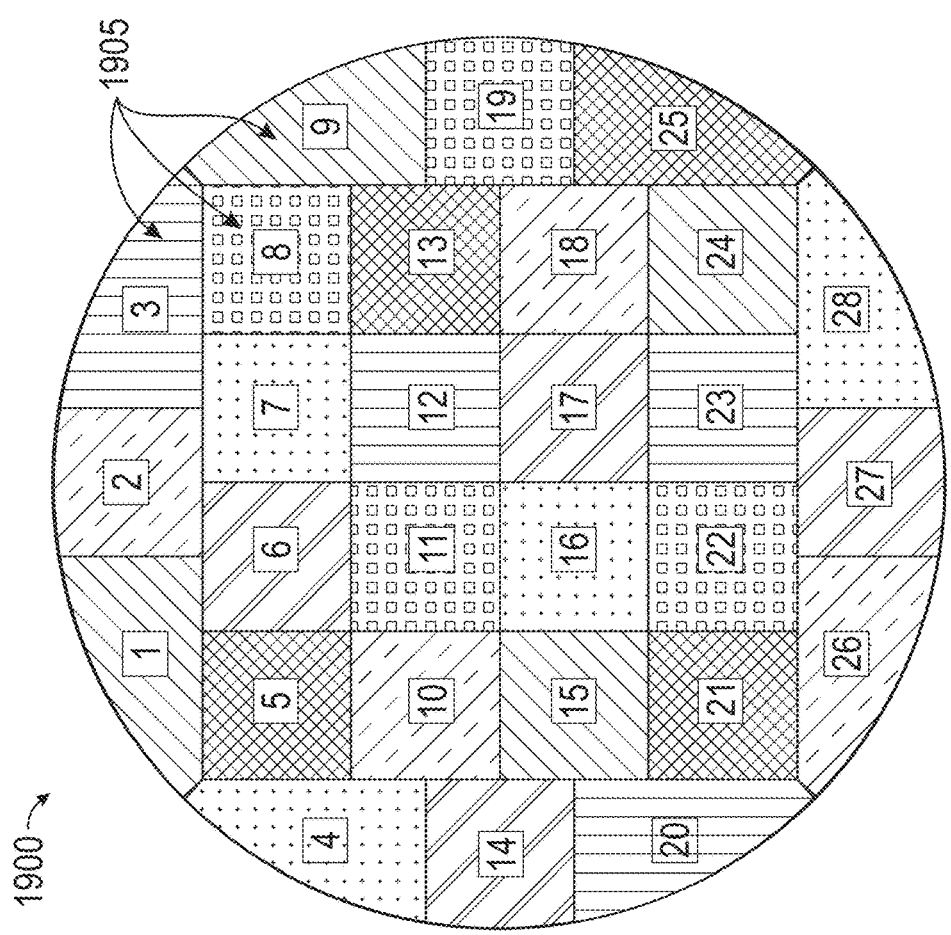
FIG. 19 illustrates a plan view of an example TCW comprising heater zones and corresponding table, according to some embodiments.

As previously mentioned, activating only a subset of the number of thermal zones (heater zones or cooling zones) may allow the total energy available (electrical energy to power the heaters or coolant fluid thermal energy to cool the cooling elements) to be applied to a smaller area, which may boost the power density of that area. Higher power density means faster heating (or cooling) and also better ability to thermally manage high-powered chips during probe testing. The left-most image of FIG. 19 shows a plan view of an example of a 300 mm diameter TCW 236 with 28 heater zones. In the configuration shown in the figure, each heater zone is of approximately equivalent area (e.g., about 2500 mm$^2$). Each heater zone may comprise a heating-sensing element. A heating-sensing element may comprise a trace configured for heating during a heating time period and configured for determining resistance during a temperature sensing time period. In some instances, there must be at least two connections to each heating-sensing element (e.g., a connection on each end of the resistive trace).

One way of organizing the control and power input to the heater zones would be to have each heater zone be its own thermal channel (e.g., having its own thermal drive circuitry). In this example and considering there are 28 zones (as shown in FIG. 19), there may be a minimum of 56 pins to connect to the TCW 236 (28 zones×2 pins per zone). Continuing with this example, if there was a total power available of 7000 W for the heater zones, then the power per zone would be 7000 W/28 zones=250 W, and the power density of each heater zone would be 250 W/2500 mm$^2$ 0.1 W/mm$^2$.

One way of configuring the heater zones and corresponding heating-sensing elements is to assign two or more of the heater zones to a thermal channel. In the example of FIG. 19, there are seven thermal channels (identified by the different hatching in the image) each with four heater zones. The correspondence between thermal channel and heater zones are shown both in the graphic image on the left of FIG. 19 and in the table on the right of FIG. 19. For example, thermal channel 1 has heater zones 1, 9, 15, and 24 assigned to it. In some instances, each thermal channel and each heater zone within that thermal channel may be individually controlled. A demultiplexer (a device that can take a single input and switch it selectively to two or more outputs) can be employed with each thermal channel. For example, a 1:4 demultiplexer ("demux") can be employed with each of the seven thermal channels, allowing individual control of each of the 28 heater zones.

The properties of thermal channels and corresponding heater zones can be preprogrammed. In some examples, the properties of thermal channels and corresponding cooling zones. If FPGAs are used for thermal channel control the correspondence of zones to channels can be stored in the FPGA flash memory during FPGA programming. Changes to preprogrammed correspondences would require installing new FPGA firmware (reprogramming the FPGA). In cases where the preprogrammed correspondences are not sufficient, the control system may allow users to define how the thermal channels correspond to the zones (for either cooling or heating). For example, the user may determine which groups of heaters and/or which groups of cooling zones should be activated at the same time. In such cases, when FPGAs are used for thermal channel control, the user-defined correspondence may be stored in the FPGA RAM and would need to be reloaded into that RAM after any time the FPGA has lost power and is powered up again.

If each thermal channel is independent, then each one may have its own low voltage connection. In some instances, the low voltage connection can be common for all the heater zones in that thermal channel. More specifically, for thermal channel 1, each thermal zone (1, 9, 15 and 24) may have its own high-voltage pin. In some instances, the low voltage V pin can be common for those heater zones. The overall number of pins for a configuration that has both thermal channels and heater zones demuxed within those channels may be equal to the number of thermal zones plus the number of channels. In the example of FIG. 19, the minimum number of pins required is 28+7=35. For a configuration with 48 heater zones and nine thermal channels, the minimum number of pins required is 48+9=57.

As discussed above, examples of the disclosure may include a configuration that increases the power density of the heater zones (or cooling zones). In some instances, there may be a limit to the overall power available for the TCW 236, such as 500 W, 7000 W, or 9000 W. There may also be limits on the amount of current the wiring within the TCW 236 or TCA 160 can tolerate (see, e.g., 2A). In the example of FIG. 19, if there is a 7000 W overall power input and seven active heater zones at any one time (one of the four heater zones in each of the seven thermal channels), then each active heater zone may consume 1000 W (7000 W overall for seven thermal channels). If the current limit is approximately 2 A, for example, then the voltage required for each heater zone is 1000 W for 2 A=500V. In some examples, to achieve higher powers at reasonable current values, the thermal drive voltage may be provided by a high-voltage electrical power source, such high-voltage electrical power source having a voltage of 500V, 480V, 400V, 380V, 240V, 230V, 220V or higher than 200V.

In the example of FIG. 19, there are seven heater zones active at any one time out of 28 heater zones, and there is 7000 W total power input. The power to each active heater is 1000 W and the power density of each active heater zone is 1000 W divided by 2500 mm$^2$ or 0.4 W/mm$^2$. In some aspects, a 1:4 demultiplexing scheme allows a four times increase in heater zone power density, where each heater zone may have its own thermal channel.

In some embodiments, the power density may be based on the following relationship:

$$\text{power density of a heater zone} = \frac{\text{total power input}}{TC \times (\text{wafer area}/HZ)}$$

where TC is the number of thermal channels and HZ is the number of heater zones. As example, a 300 mm diameter TCW 236 with 48 heater zones arranged in 9 thermal channels (1 heater zone per thermal channel active at any time) and an overall power input of 9000 W may have a power density of each heater zone of 9000 W/(9*(Pi*(150 mm)$^2$)/48)=0.68 W/mm$^2$. In general, the TCA 160 may be designed to provide high power density to the heater zones—such as greater than 0.01 W/mm$^2$ or greater than 0.05 W/mm$^2$ or greater than 0.1 W/mm$^2$ or even higher power density.

As previously discussed, inputs to the thermal controller 180 may include DUT power or internal DUT temperature, in addition to the temperature of one or more heater zones. In such cases, the thermal controller 180 may be configured to determine a temperature of at least one of the plurality of independently controllable heater zones and receive an input indicative of an amount of power of a device under test (DUT), a temperature of the DUT, or both, wherein the selective control of the plurality of independently controllable thermal zones comprises controlling an amount of power to one or more thermal channels of the TCA 160 based on the determined temperature and the received input.

Figure 20:
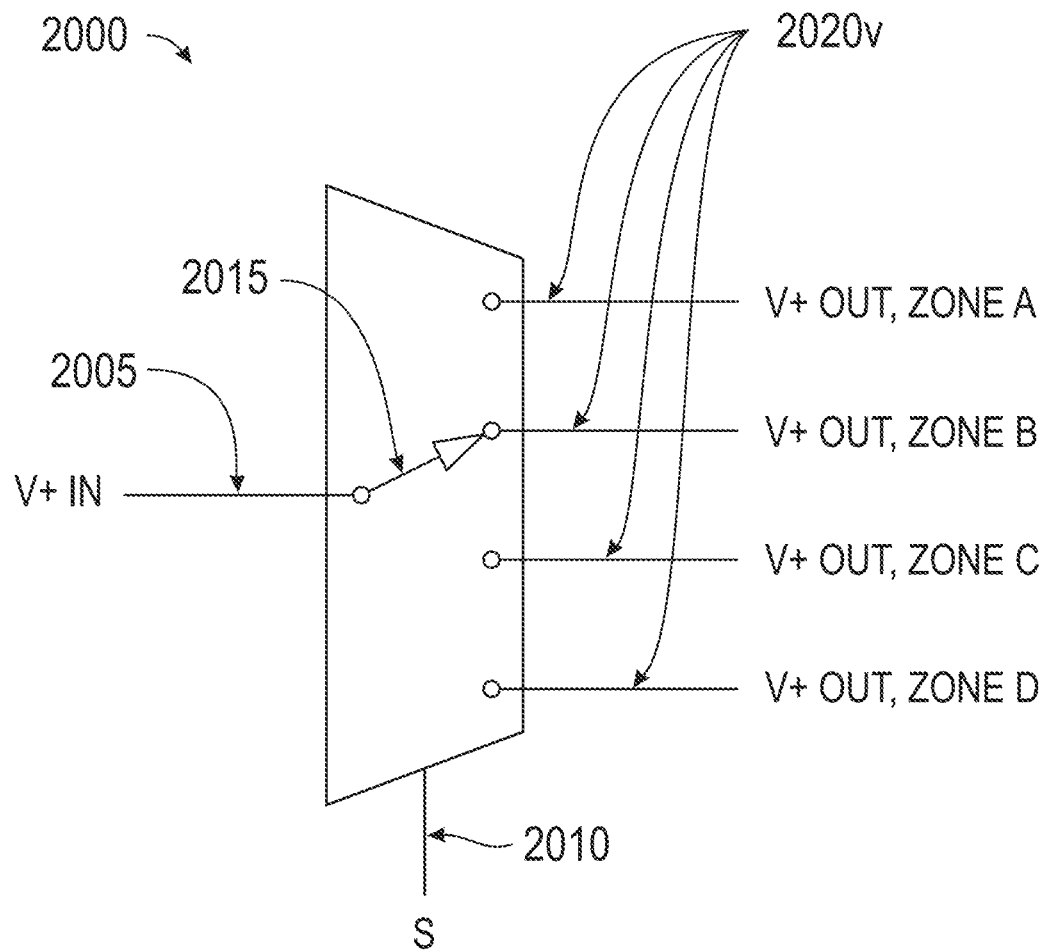
FIG. 20 illustrates an example demultiplexer that may be used in conjunction with a TCW, according to some embodiments.

FIG. 20 shows an example demultiplexer 2000 that may be used in conjunction with a TCW (e.g., the 28 zone TCW 236 shown in FIG. 19). Each of the seven thermal channels of FIG. 19 may use this 1:4 demultiplexer 2000 as part of the thermal drive circuitry for a thermal channel. A high-voltage (V+) input 2005 (e.g., a 480V input) can be connected alternatively to each of the V+ outputs 2020 depending on an internal switch connection 2015. A select S input 2010 is used to select which V+ output 2020 to connect to the V+ input. In the example demultiplexer 2000 of FIG. 20, the V+ input 2005 may be alternately applied to one of the four V+ outputs 2020 that are connected to four heater zones (labeled as zones A, B, C, and D). If a demultiplexer 2000 as shown in FIG. 20 was applied to thermal channel ID 7 of FIG. 19, then the V+ input 2005 could be applied to any of heater zones 8, 11, 19, or 22.

In some embodiments, a 1:3, a 1:4, a 1:5, a 1:6, or any other configuration of a demultiplexer 2000 may be used in the thermal drive circuitry for a thermal channel of a TCW 236. In some embodiments, one thermal channel may use a demultiplexer 2000 with one ratio of input to outputs (e.g., 1:4), while a second thermal channel in the same TCW 236 may use a demultiplexer 2000 with a second, different ratio of input to outputs (e.g., 1:6). A thermal controller 180 associated with the TCA 160 can control any demultiplexers 2000 that are used as part of the circuitry for the thermal channels. In some embodiments, both the control circuitry for the heaters and the control circuitry for the cooling zones can be demultiplexed. The demultiplexing scheme for both the heater zones and cooling zones may be similar to each other.

Figure 21:
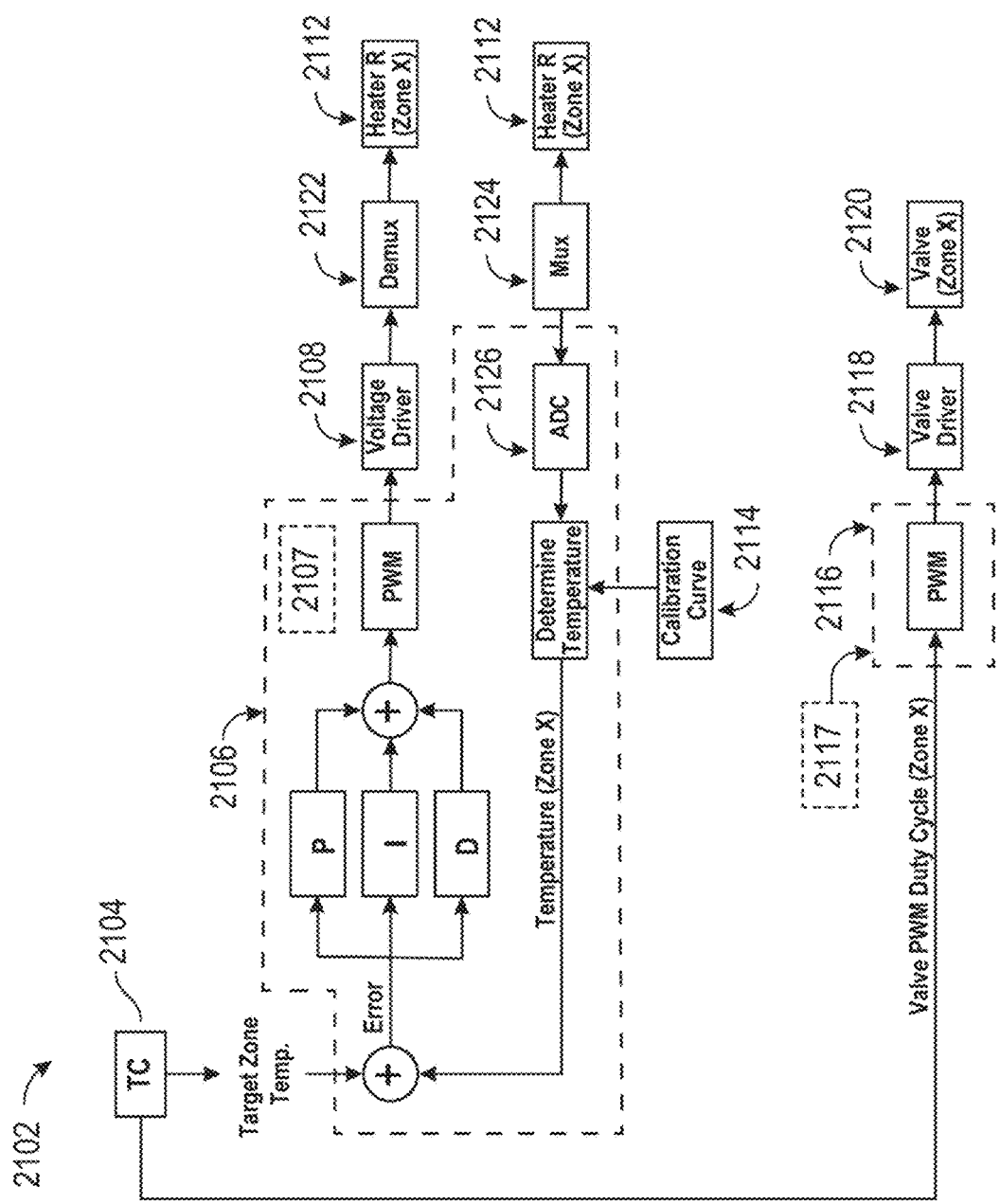
FIG. 21 illustrates an example of part of a thermal controller that includes FPGAs, according to some embodiments.

In some embodiments, there may be two FPGAs used as part of the control scheme, with a first FPGA dedicated to controlling the heater zones and measuring their temperature. A second FPGA may be dedicated to controlling the coolant flow valves for each cooling zone. FIG. 21 is an example of part of a thermal controller 2102 that includes a first FPGA 2106 and a second FPGA 2116. The operation of the first FPGA 2106 may be based on an input target zone temperature and FPGA 2106 may perform PID and PWM calculations to determine a PWM duty cycle that is input to a voltage driver 2108 which in turn powers a particular heater 2110 in a heater zone of a thermal channel (accessed through a demultiplexer 2122). The FPGA also determines temperatures of heater zones by determining the heater trace resistance 2112 of a particular heater zone, and through knowledge of a pre-determined calibration curve 2114, the FPGA determines the temperature of the heater zone. The temperature of the heater zone is compared to the target zone temperature and the process repeats, creating a closed loop feedback control of the heater zone temperatures. The pre-determined data that establishes the calibration curve 2114 of heater zone trace resistance to heater zone temperature may be stored within the first FPGA 2106 or within a device external to the first FPGA 2106.

The second FPGA 2116 may receive a target valve PWM duty cycle as an input, and from that, determine PWM signals to control a valve driver 2118 that opens and closes a valve 2120. The valve 2120 controls coolant fluid flow to a cooling zone. As shown in FIG. 21, in some cases, the cooling control is run without feedback. The target valve PWM duty cycle may be determined by the control software, by user input, by calibration of the TCA over various heating and cooling scenarios, or by other means. In some cases, the thermal control device (TC) 2104 may coordinate the control of both the heaters 2112 and coolant fluid control valves 2120 in active zones simultaneously to achieve the desired zone temperature.

In some embodiments, a PID function may be included with the second FPGA 2116 circuitry. creating a closed loop control system for cooling based on a control variable such as the heater zone temperature. With respect to controlling a coldplate's fluid flow rate (and thus its cooling ability), the total power applied to the heater-sensing elements on the TCW 236 can be used as a control input. In some cases, the two FPGAs may communicate with each other to accomplish thermal control functions.

FIG. 21 depicts each FPGA in operation for one heater zone or one coolant zone, but the control of the heating and cooling zones may be demultiplexed such that each FPGA can control multiple zones. In other cases, demultiplexing is not required, such as the case where the second FPGA 2116 may directly control all fluid control valves 2120 without the need for a demultiplexer.

While the preceding description has referred to the use of FPGAs as part of the control scheme, any device that can support similar functions could be used, such as a microcontroller, a CPU, a microprocessor, or any other computing device. Furthermore, the thermal control device (TC) 2104 can be a computer, a microcontroller, a CPU, a microprocessor, or any other computing device suitable for the function. The thermal controller 2102 of FIG. 21 would encompass the TC 2104 along with the first FPGA 2106 and the second FPGA 2116.

FIG. 21 shows a processor-readable medium 2107 associated with FPGA 2106 and a processor-readable medium 2117 associated with FPGA 2116. In this example, FPGA 2106 comprises processor-readable medium 2107, such as Flash memory within the FPGA, while processor-readable medium 2117 is physically separate from but coupled to FPGA 2116, such as a separate memory chip or a hard disk drive. The thermal controller 2102 could comprise various other types and configurations of processor-readable media coupled with an FPGA, a processor, a computer or any other computing device.

Figure 22:
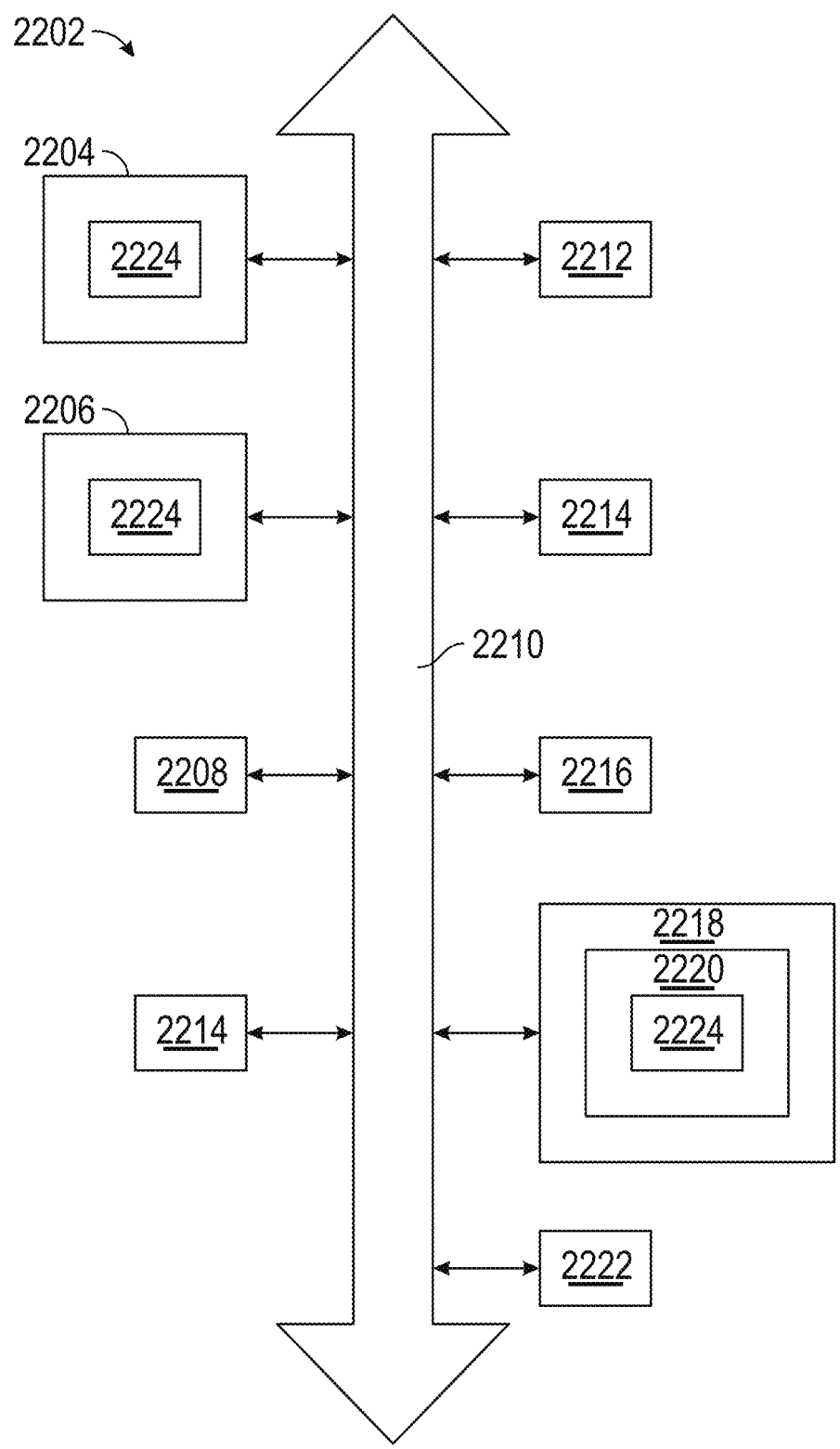
FIG. 22 illustrates a block diagram of an example computer used for one or more controllers, according to some embodiments.

FIG. 22 illustrates a block diagram of an exemplary computer 2202 used for one or more controllers, according to embodiments of the disclosure. The computer may be a machine, within which a set of instructions causes the machine to perform any one of the methodologies discussed herein, may be executed, according to embodiments of the disclosure. In some embodiments, the machine can operate as a standalone device or may be connected (e.g., networked) to other machines. In a networked configuration, the machine may operate in the capacity of a server or a client machine in a server-client network environment, or as a peer machine in a peer-to-peer (or distributed) network environment. The machine can be a personal computer (PC), a tablet PC, a set-top box (STB), a personal digital assistant (PDA), a cellular telephone, a web appliance, a network router, a switch or bridge, or any machine capable of executing a set of instructions (sequential or otherwise) that specify actions to be taken by that machine. A mobile device may include an antenna, a chip for sending and receiving radio frequency transmissions and wireless communications, and a keyboard. Further, while only a single machine is illustrated, the term "machine" shall also be taken to include any collection of machines that individually or jointly execute a set (or multiple sets) of instructions to perform any one of the methodologies discussed herein.

The exemplary computer 2202 includes a processor 2204 (e.g., a central processing unit (CPU), a graphics processing unit (GPU), or both), a memory 2206 (e.g., read-only memory (ROM), flash memory, dynamic random access memory (DRAM) such as synchronous DRAM (SDRAM), etc.), and a static memory 2208 (e.g., static random access memory (SRAM), etc.), which can communicate with each other via a bus 2210.

The computer 2202 may further include a video display 2212 (e.g., a liquid crystal display (LCD) or light emitting diode (LED) display). The computer 2202 also includes an alpha-numeric input device 2214 (e.g., a keyboard), a cursor control device 2216 (e.g., a mouse), a disk drive unit 2218, a signal generation device, a network interface device 2222, and one or more wireless interface devices.

The computer 2202 may also include other inputs and outputs, including digital I/O and/or analog I/O. For example, the inputs and outputs may communicate with external devices, such as chillers, pressure controllers, force controllers, flow value controllers, etc., using any type of communication protocol.

The drive unit 2218 includes a machine-readable medium 2220 on which is stored one or more sets of instructions 2224 (e.g., software) embodying any one or more of the methodologies or functions described herein. The software may also reside, completely or at least partially, within the main memory 2206 and/or within the processor 2204 during execution thereof by the computer 2202, the main memory 2206 and the processor 2204 also constituting machine-readable media. The software may further be transmitted or received over a network via the network interface device 2222 and/or a wireless device.

While the machine-readable medium 2220 is shown in an exemplary embodiment to be a single medium, the term "machine-readable medium" should be taken to include a single medium or multiple media (e.g., a centralized or distributed database and/or associated caches and servers) that store the one or more sets of instructions. The term "machine-readable medium" shall also be taken to include any medium that is capable of storing, encoding, or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A method for controlling one or more temperatures of one or more devices under test (DUTs), the method comprising:
   receiving an energy input to a thermal control assembly (TCA); and
   independently controlling a plurality of independently controllable thermal zones of the TCA, comprising:
      selectively controlling a plurality of independently controllable heater zones of the plurality of independently controllable thermal zones, comprising selectively applying the energy input to one or more of the plurality of independently controllable heater zones; and
      selectively controlling a plurality of independently controllable cooling zones of the plurality of independent controllable thermal zones,
   wherein the plurality of independently controllable heater zones and the plurality of independently controllable cooling zones are configured to maintain or change a temperature of a top surface of the TCA.

2. The method of claim 1, wherein selectively applying the energy input comprises selectively applying, by a demultiplexer, the energy input to two or more of the plurality of independently controllable heater zones.

3. The method of claim 1, wherein the receiving the energy input comprises receiving the input energy by a high-voltage electrical power source, wherein the high-voltage electrical power source provides a voltage of 200V or higher.

4. The method of claim 1, wherein the receiving the energy input comprises receiving the input energy by a high-voltage electrical power source, wherein the high-voltage electrical power source provides a voltage of 500V, 480V, 400V, 380V, 240V, 230V, or 220V.

5. The method of claim 1, wherein the plurality of independently controllable thermal zones maintaining or changing the temperature of the top surface of the TCA comprises maintaining or changing a temperature of a component placed on the top surface of the TCA.

6. The method of claim 5, wherein the component is a semiconductor wafer or panel.

7. The method of claim 6, wherein the semiconductor wafer or panel comprises singulated dies.

8. The method of claim 1, wherein the TCA is configured to receive a semiconductor wafer or panel on the top surface of the TCA, and a perimeter of the TCA is between 1-1.3 times greater than a perimeter of the semiconductor wafer or panel.

9. The method of claim 1, comprising:
   receiving a wafer under test (WUT) on the top surface of the TCA, the WUT comprising at least one chip, the at least one chip being a device under test (DUT).

10. The method of claim 9, wherein a size of at least one of the plurality of independently controllable thermal zones is substantially the same size as the at least one chip.

11. The method of claim 9, wherein an area of at least one of the plurality of independently controllable thermal zones is smaller than an area of the at least one chip.

12. The method of claim 9, wherein an area of two or more of the plurality of independently controllable thermal zones is equal to or greater than an area of the at least one chip.

13. The method of claim 1, comprising:
   electrically coupling the TCA to a wafer prober system, the wafer prober system comprising a probe card having probes that electrically couple to a device under test (DUT) during testing, wherein a size of at least one of the plurality of independently controllable thermal zones is substantially the same as a size of an area of the probe card.

14. The method of claim 1, comprising:
   electrically coupling the TCA to a wafer prober system, wherein the wafer prober system comprises a probe card having probes that electrically couple to a device under test (DUT) during testing, wherein a size of at least one of the plurality of independently controllable thermal zones is larger than a size of an area of the probe card.

15. The method of claim 1, comprising:

electrically coupling the TCA to a wafer probe system, wherein the wafer probe system comprises a chuck base, and the TCA is configured to be located over the chuck base.

16. The method of claim 1, comprising:

electrically coupling an electromagnetic interference (EMI) shield layer to an electrical ground, wherein the EMI shield layer is a conductive layer of a thermal control wafer (TCW).

17. The method of claim 1, comprising:

configuring one or more resistive traces as heating-sensing elements, wherein the one or more resistive traces are included in a conductive layer of a thermal control wafer (TCW).

18. The method of claim 1, comprising:

electrically coupling a two-wire connection to each of one or more resistive traces of a conductive layer of a thermal control wafer (TCW).

19. The method of claim 18, comprising:

electrically coupling the two-wire connection to a pair of pins;

electrically coupling the pair of pins to a four-wire connection; and electrically coupling the four-wire connection to circuitry outside of the TCW.

20. The method of claim 1, comprising:

dissipating electrostatic charges using a thermal control wafer (TCW), wherein a top surface of the TCW is located adjacent to a semiconductor wafer or panel.

21. The method of claim 1, comprising:

selectively electrically coupling the top surface of the TCW to ground or other electrical potential.

22. The method of claim 1, wherein at least one of the plurality of independently controllable heater zones has a power density of 0.05 W/mm$^2$ or higher.

23. The method of claim 1, wherein at least one of the plurality of independently controllable heater zones has a power density of 0.01 W/mm$^2$ or higher.

* * * * *